(12) United States Patent
Khakifirooz et al.

(10) Patent No.: US 8,455,932 B2
(45) Date of Patent: Jun. 4, 2013

(54) LOCAL INTERCONNECT STRUCTURE SELF-ALIGNED TO GATE STRUCTURE

(75) Inventors: Ali Khakifirooz, Slingerlands, NY (US); Kangguo Cheng, Guilderland, NY (US); Bruce B. Doris, Brewster, NY (US); Wilfried E. Haensch, Somers, NY (US); Balasubramanian S. Haran, Watervliet, NY (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 13/102,073

(22) Filed: May 6, 2011

(65) Prior Publication Data

US 2012/0280290 A1 Nov. 8, 2012

(51) Int. Cl.
*H01L 21/336* (2006.01)

(52) U.S. Cl.
USPC ........... 257/288; 257/270; 257/296; 257/315; 257/330; 257/336; 438/149; 438/152; 438/197; 438/259; 438/270

(58) Field of Classification Search
None
See application file for complete search history.

(56) References Cited

U.S. PATENT DOCUMENTS 7,332,766 B2 * 2/2008 Hasegawa et al. ............ 257/315

* cited by examiner

*Primary Examiner* — Kyoung Lee
(74) *Attorney, Agent, or Firm* — Scully, Scott, Murphy & Presser, P.C.; H. Daniel Schnurmann

(57) ABSTRACT

A common cut mask is employed to define a gate pattern and a local interconnect pattern so that local interconnect structures and gate structures are formed with zero overlay variation relative to one another. A local interconnect structure may be laterally spaced from a gate structure in a first horizontal direction, and contact another gate structure in a second horizontal direction that is different from the first horizontal direction. Further, a gate structure may be formed to be collinear with a local interconnect structure that adjoins the gate structure. The local interconnect structures and the gate structures are formed by a common damascene processing step so that the top surfaces of the gate structures and the local interconnect structures are coplanar with each other.

20 Claims, 29 Drawing Sheets

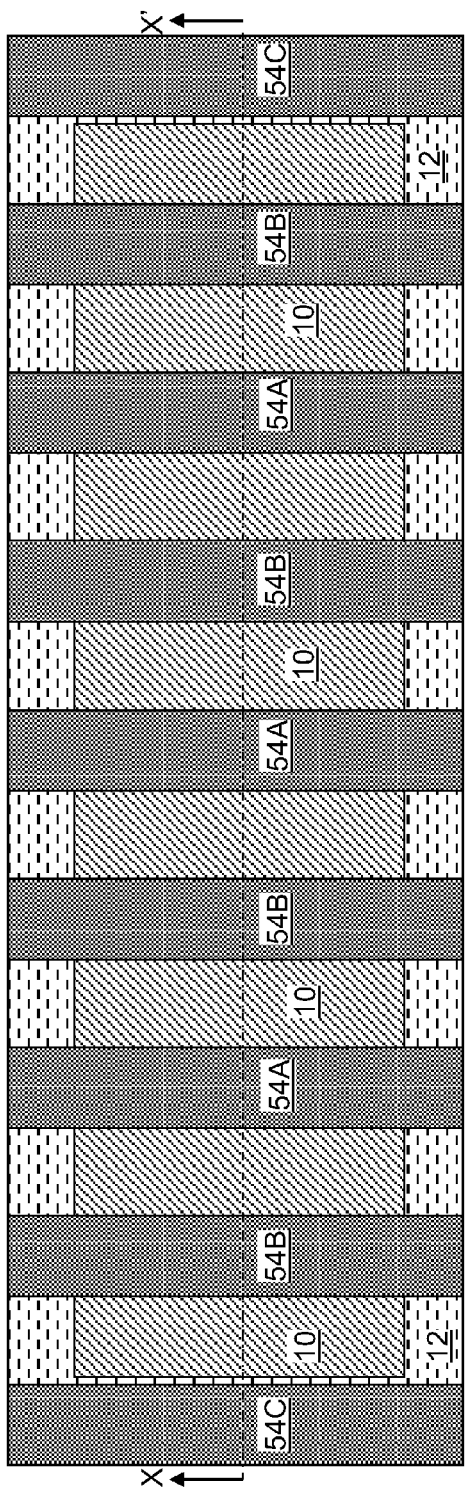
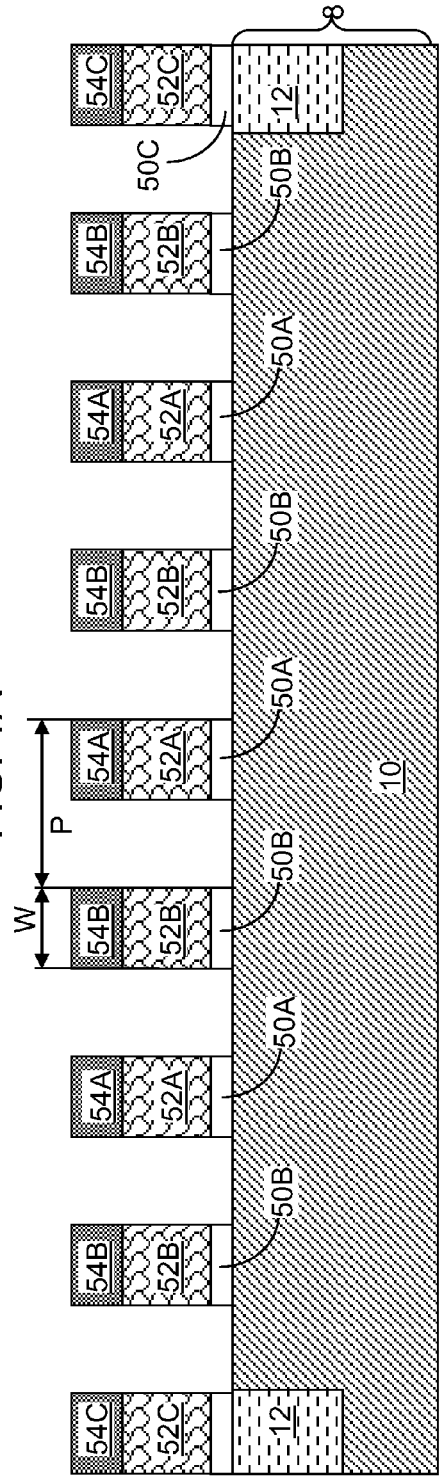
FIG. 1A
FIG. 1B

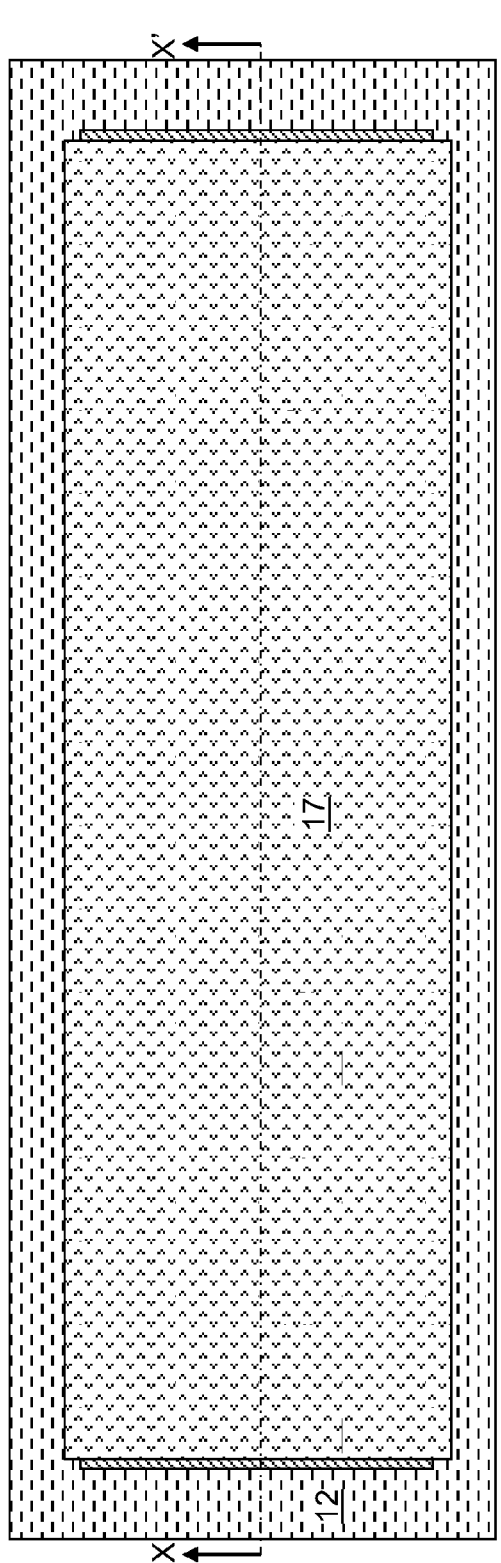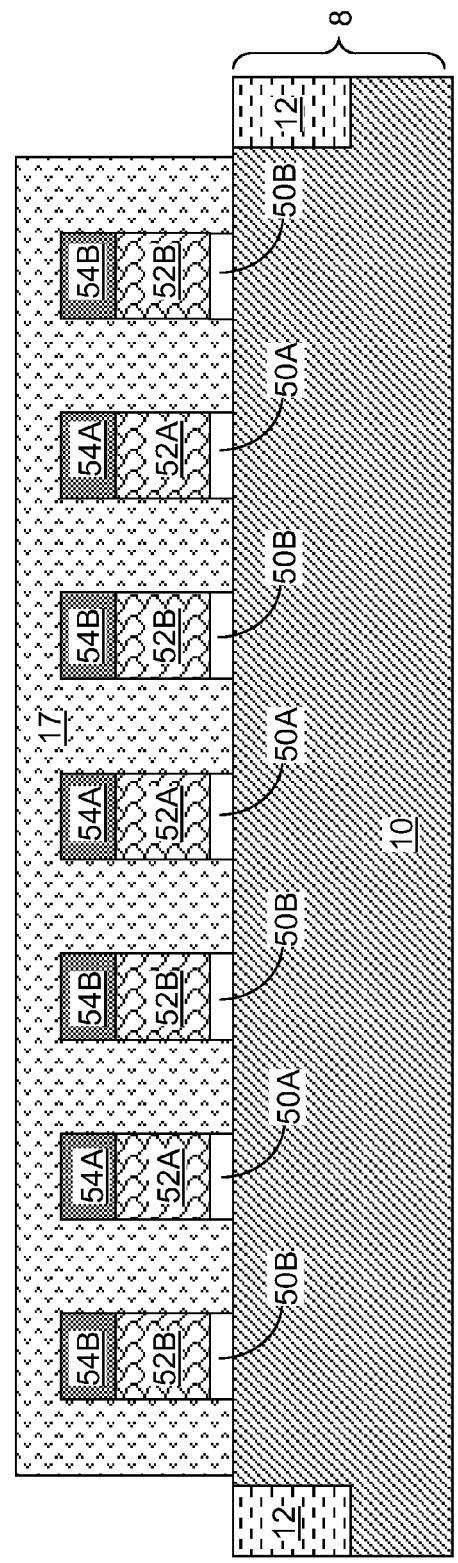
FIG. 2A
FIG. 2B

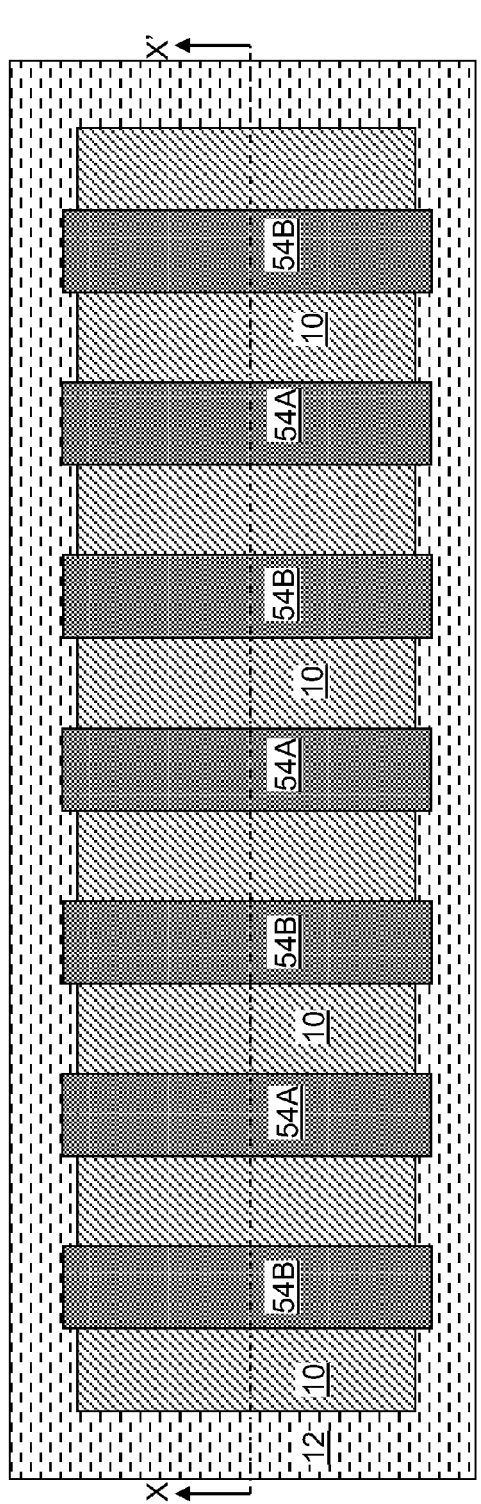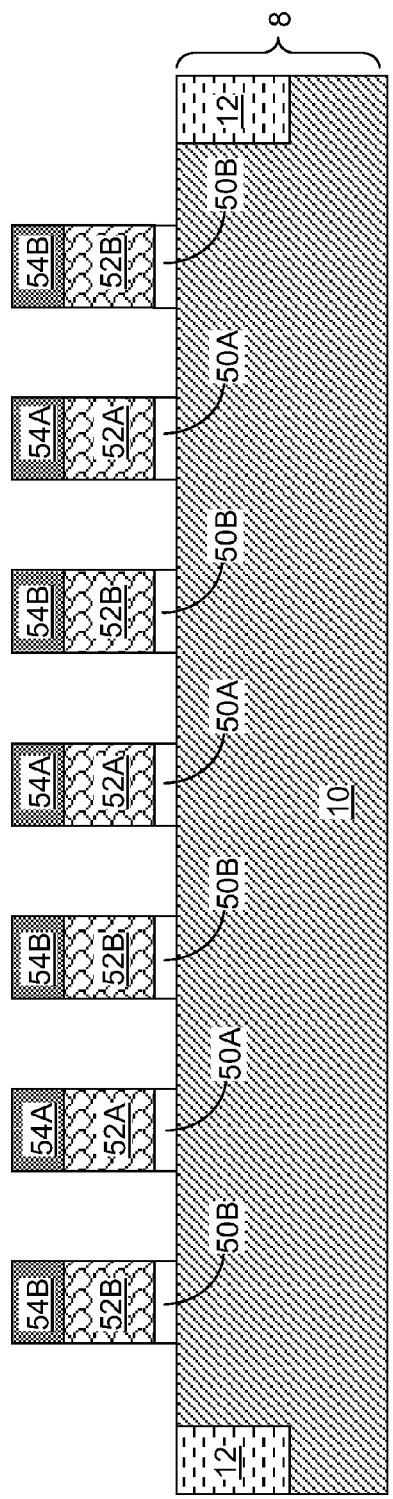

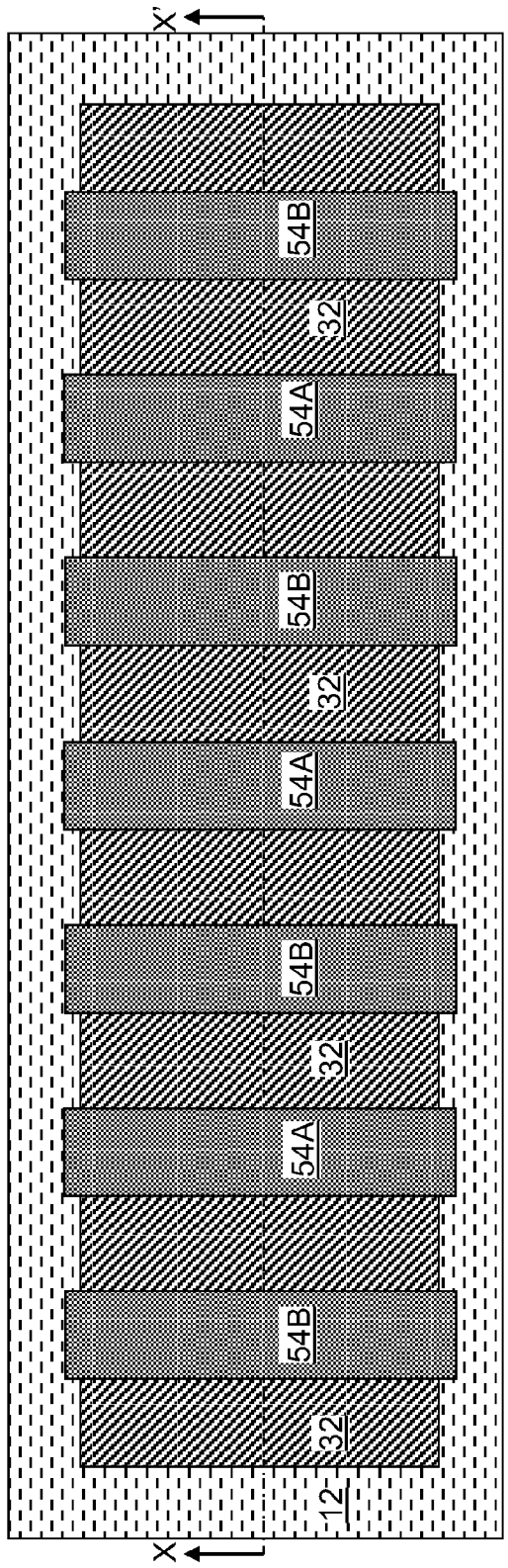
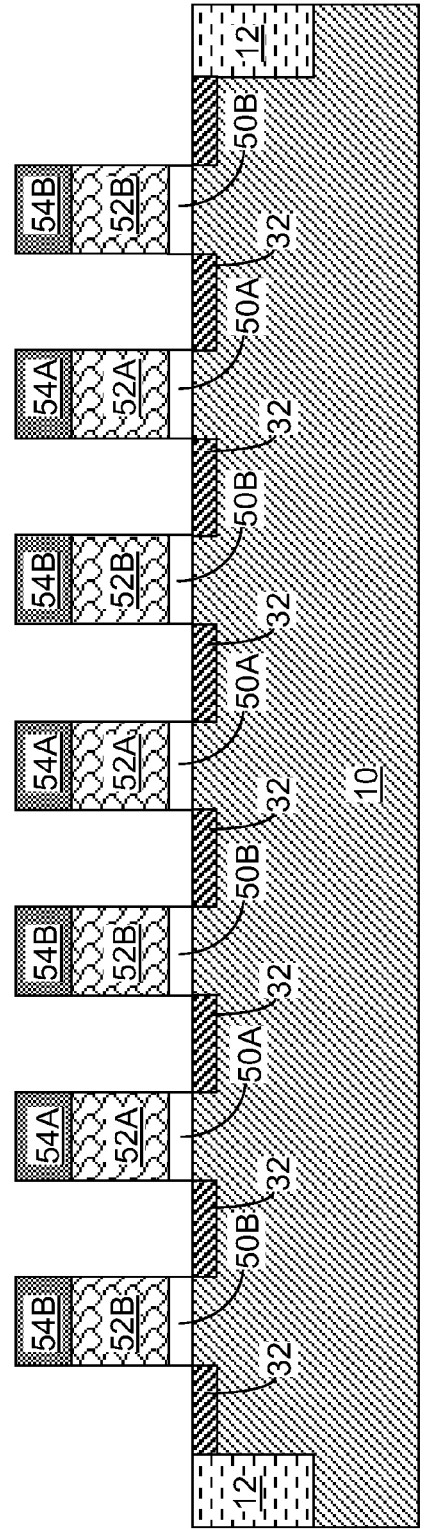
FIG. 4A
FIG. 4B

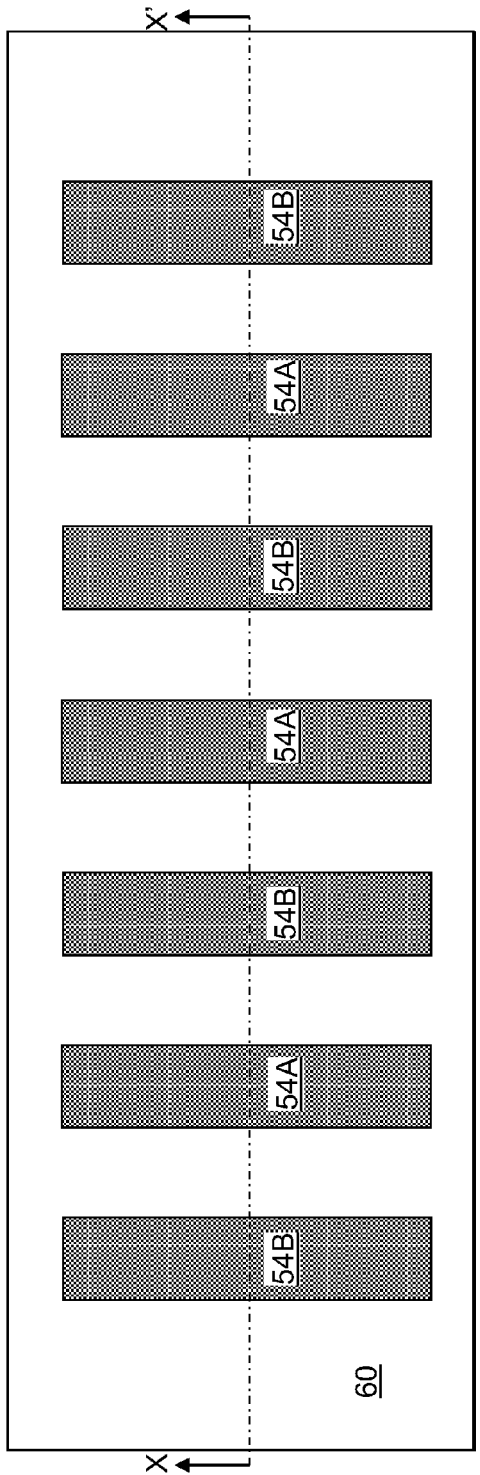
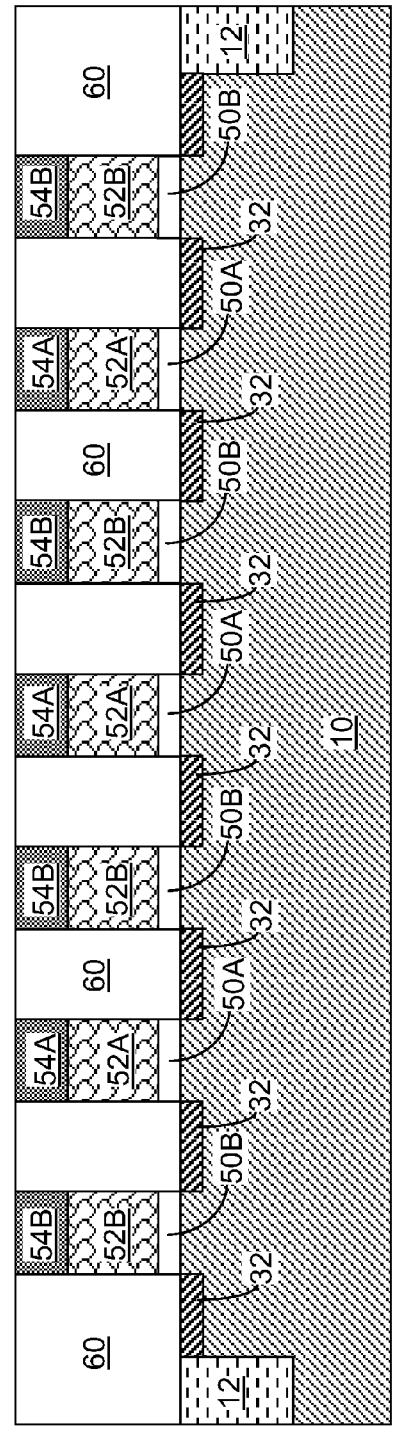

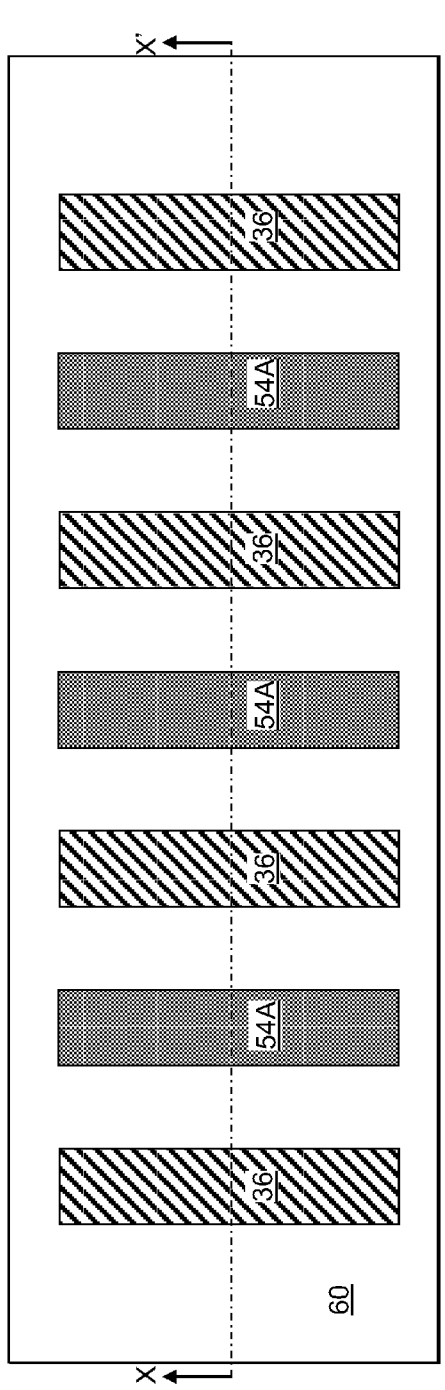
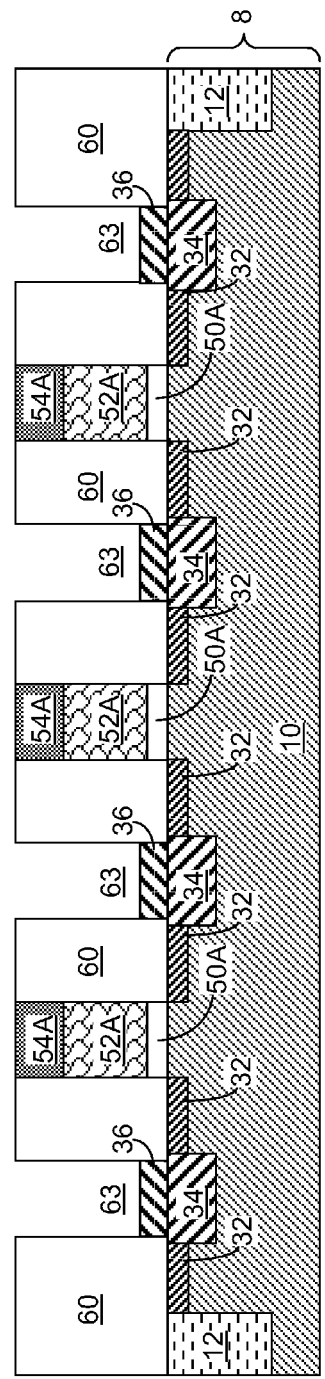

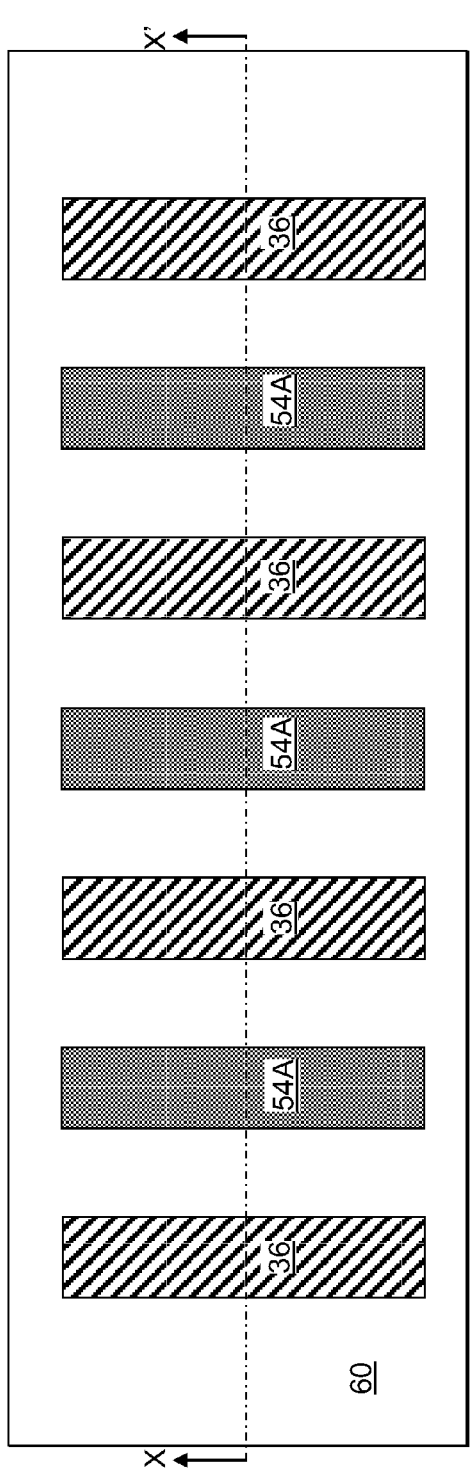
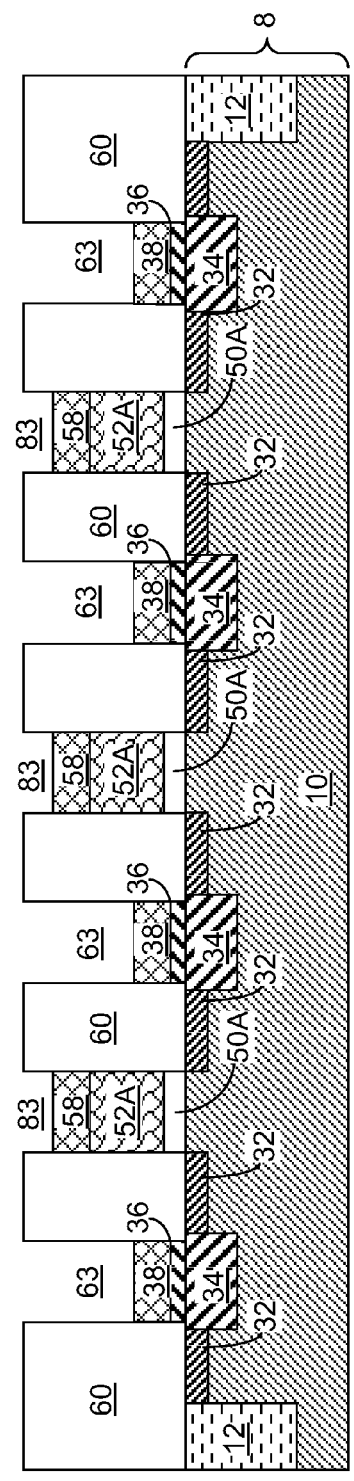
FIG. 8A
FIG. 8B

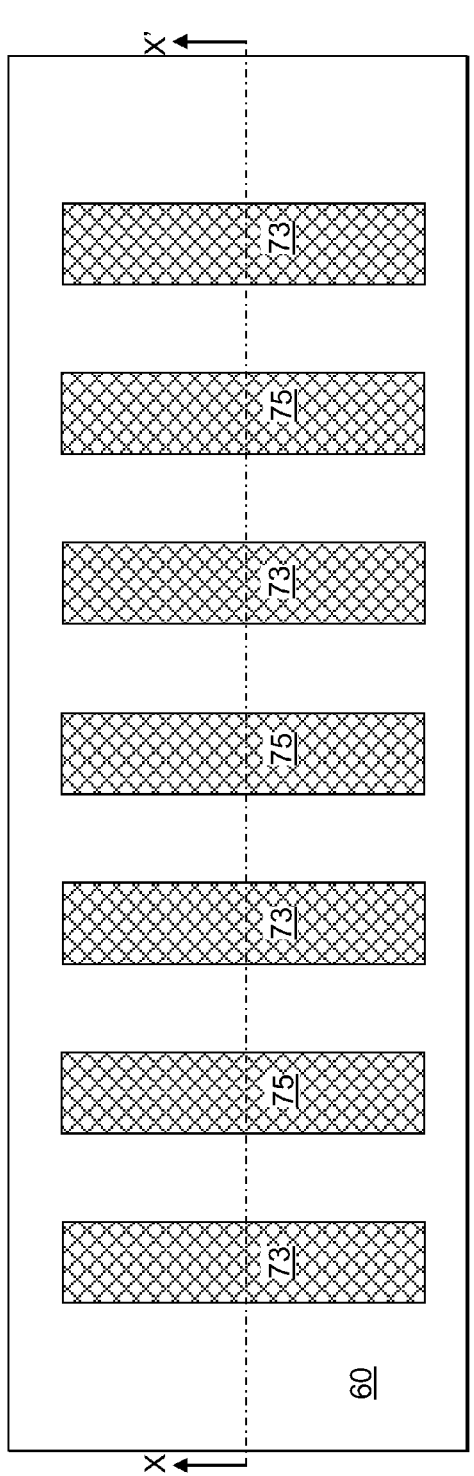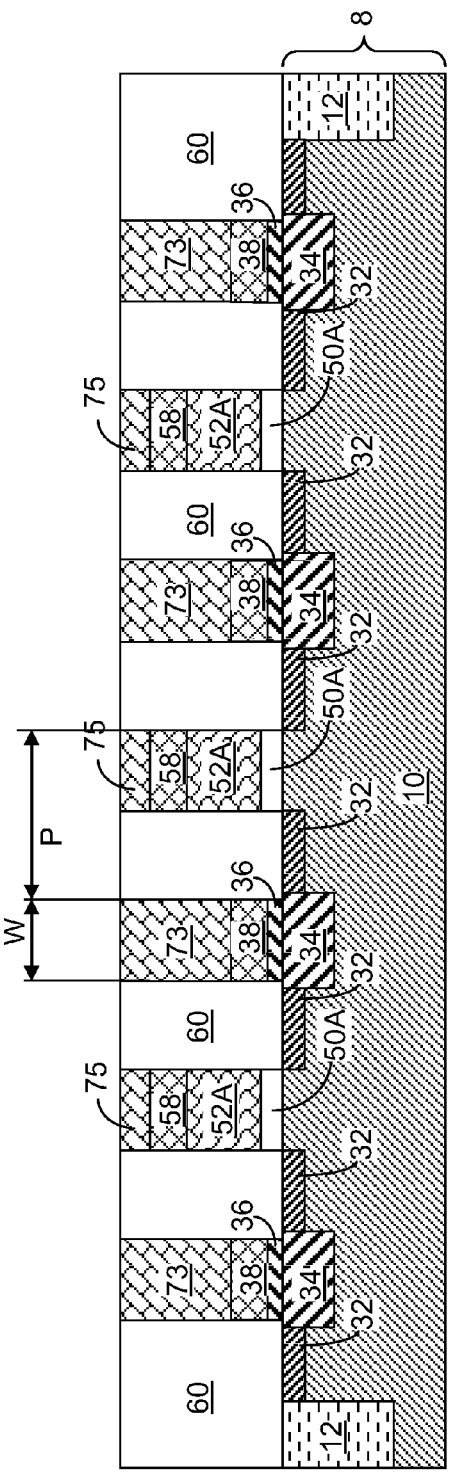
FIG. 9A
FIG. 9B

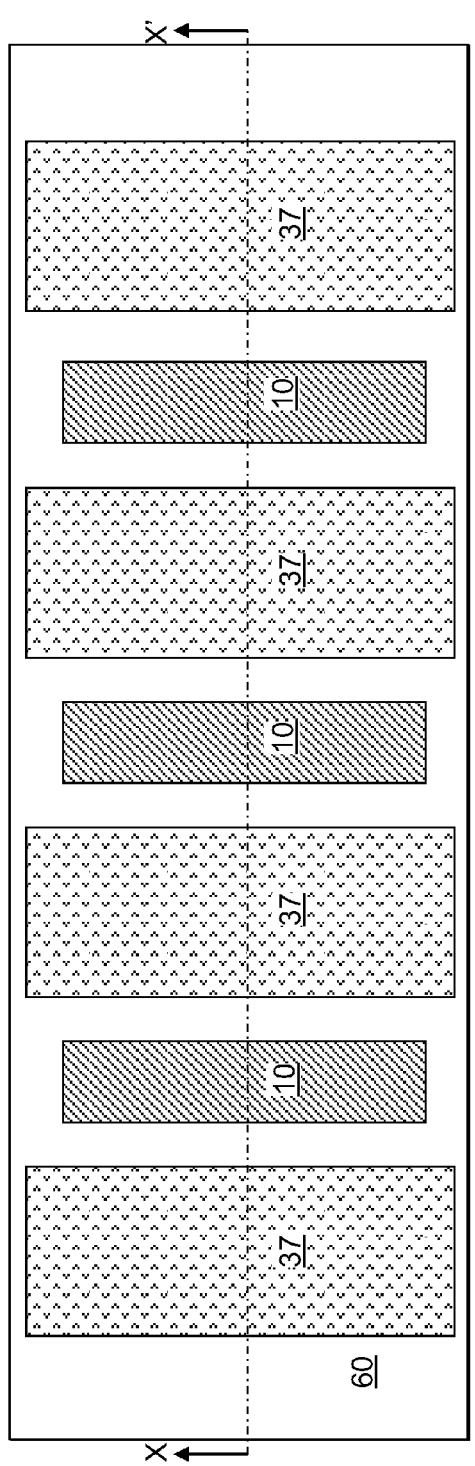
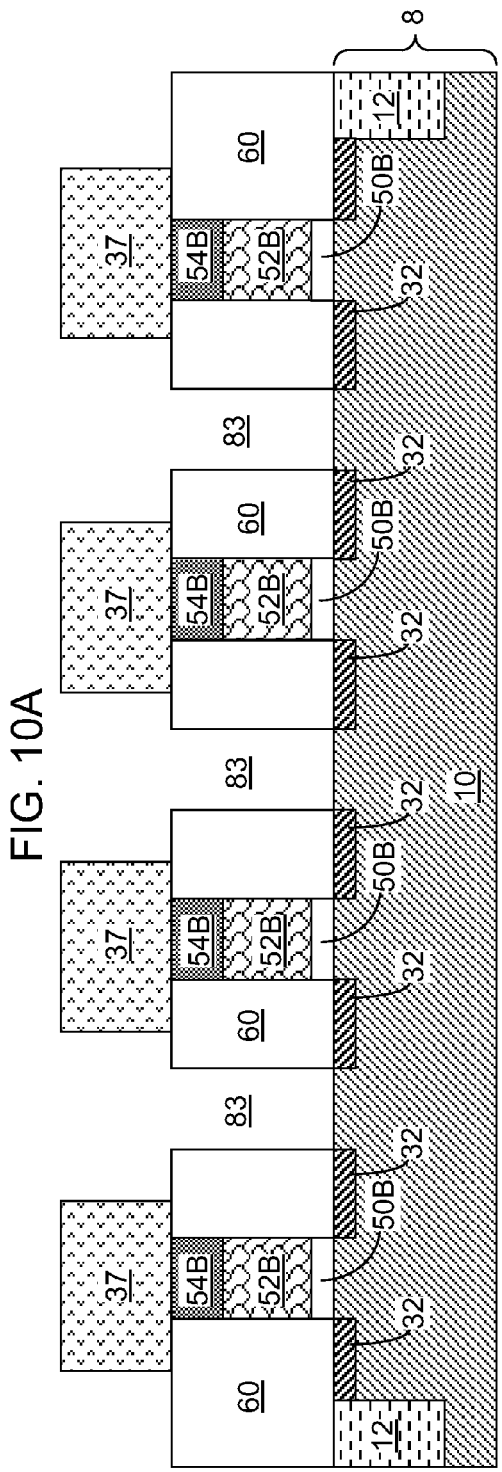

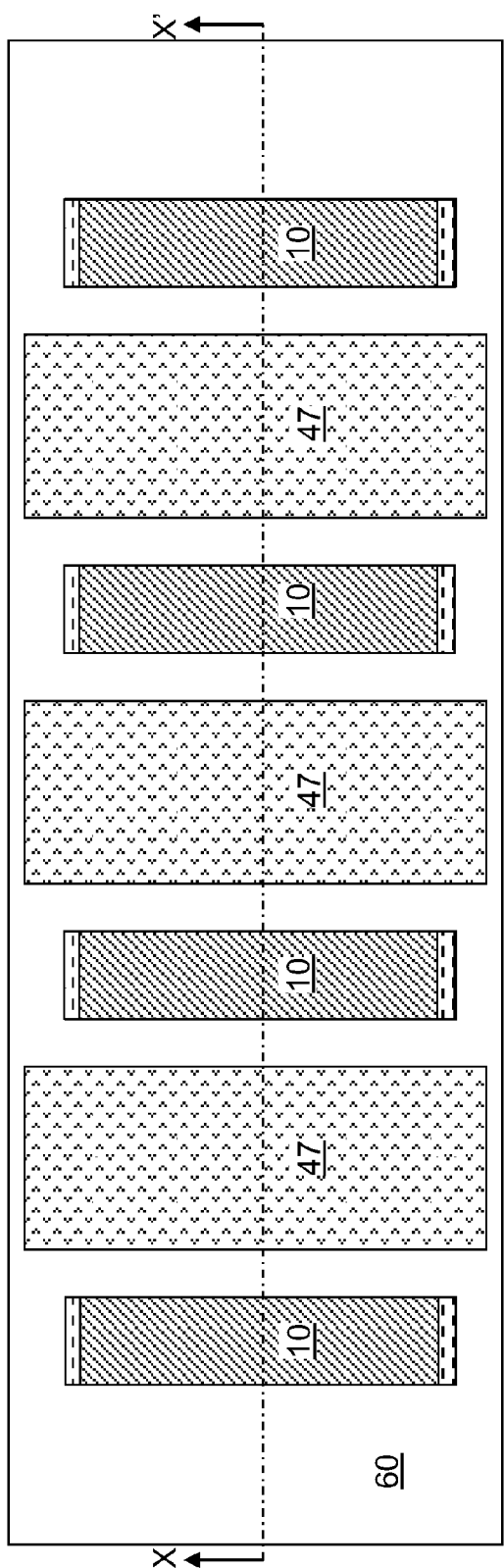
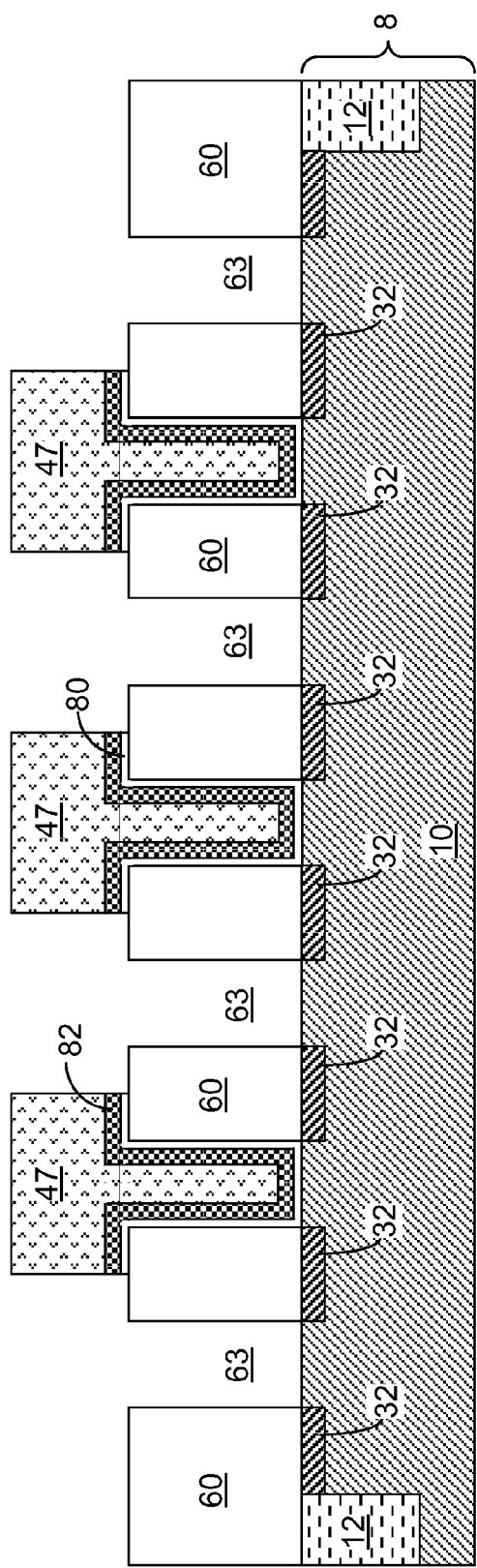
FIG. 12A
FIG. 12B

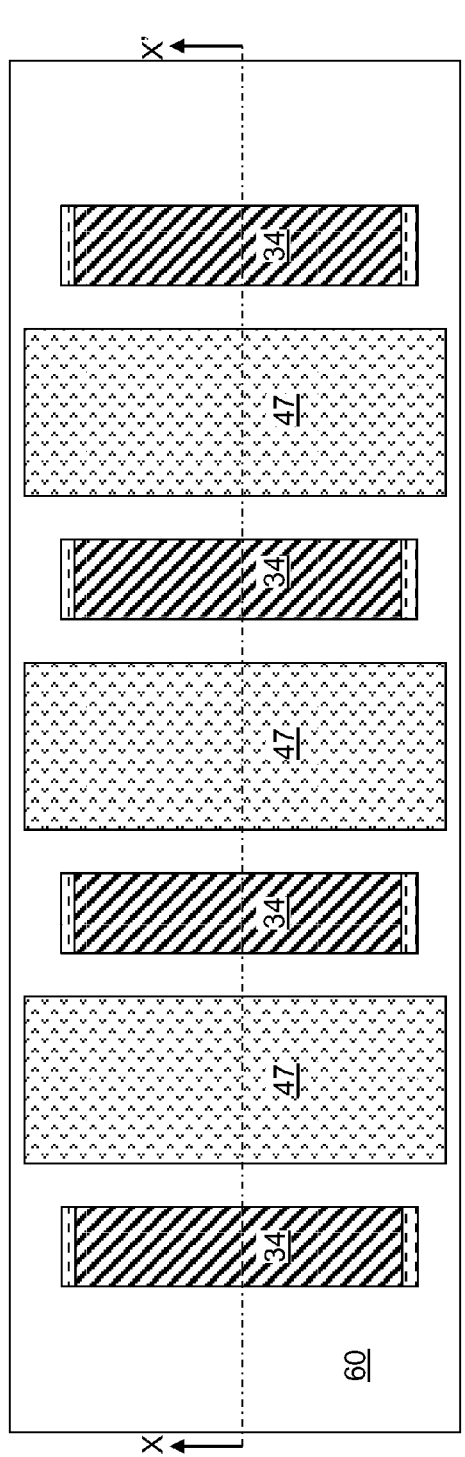
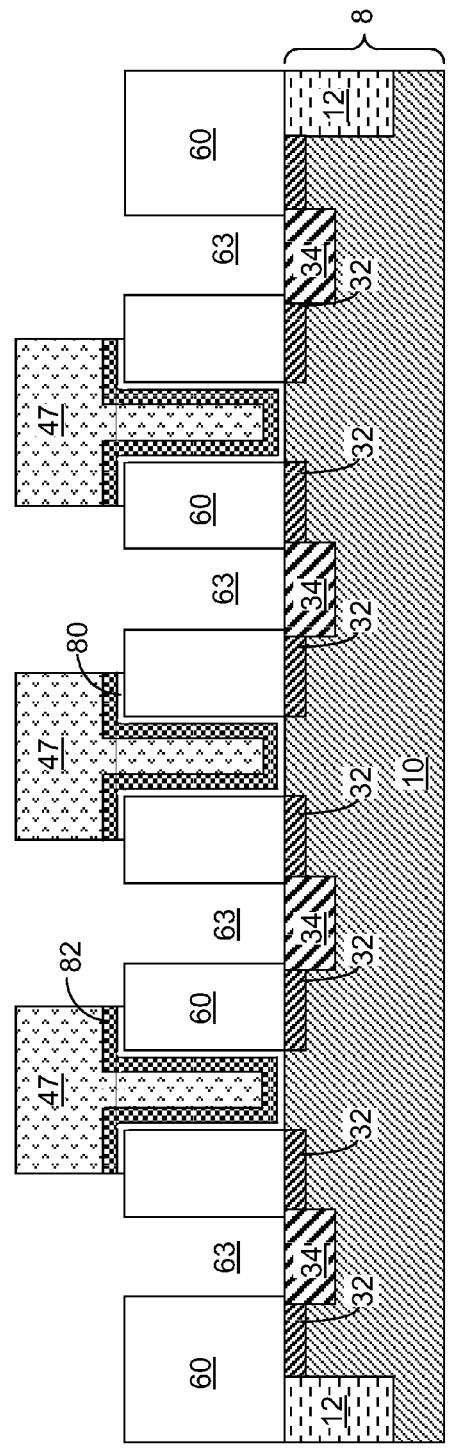
FIG. 13A
FIG. 13B

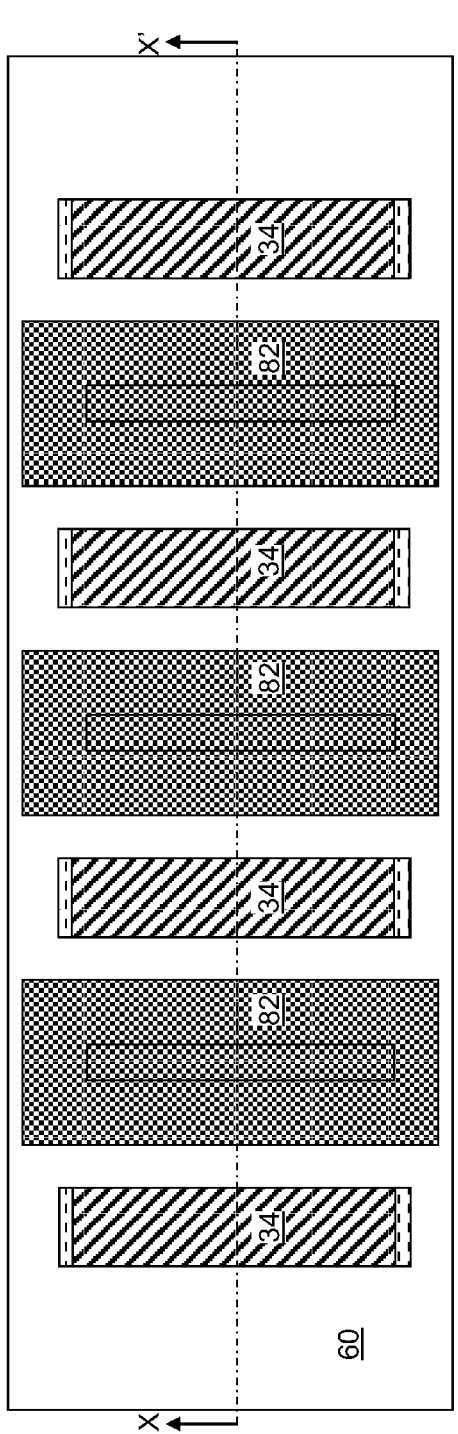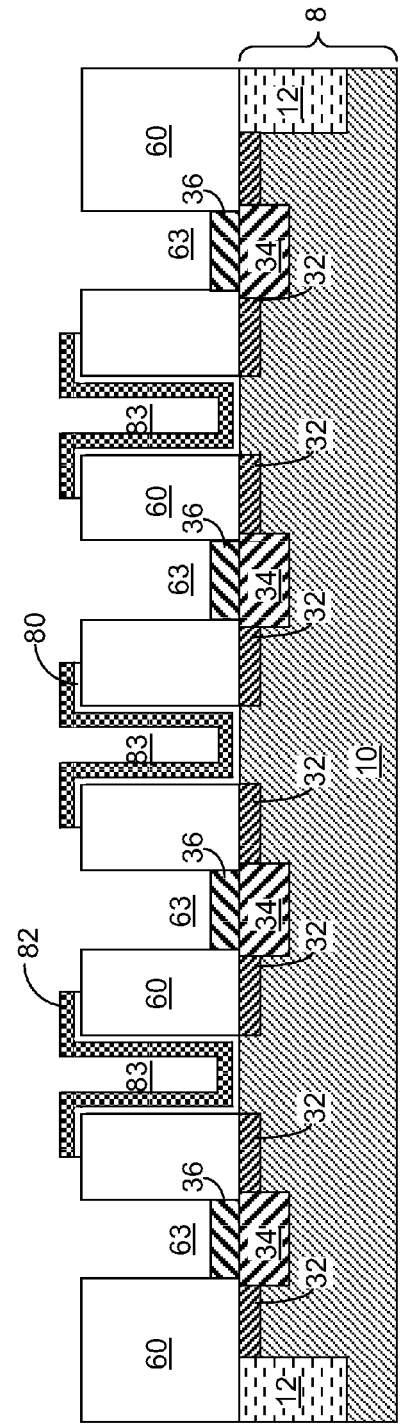

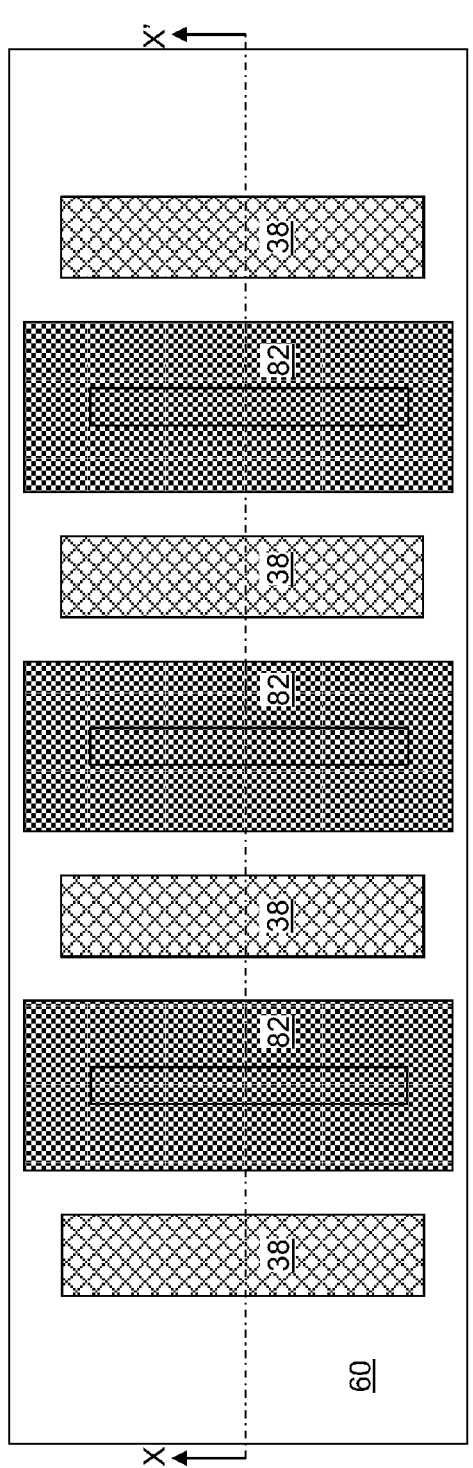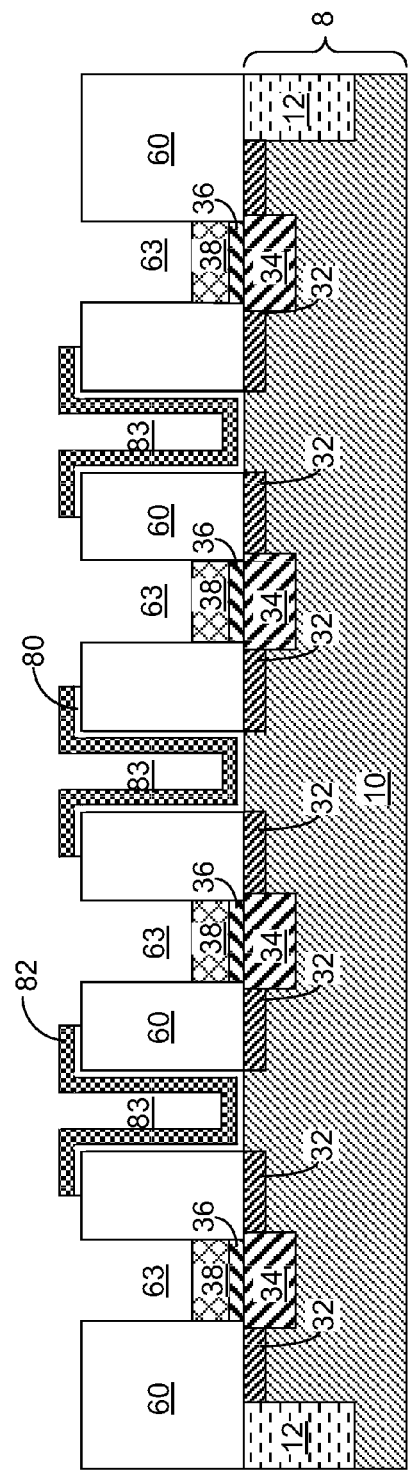
FIG. 15A
FIG. 15B

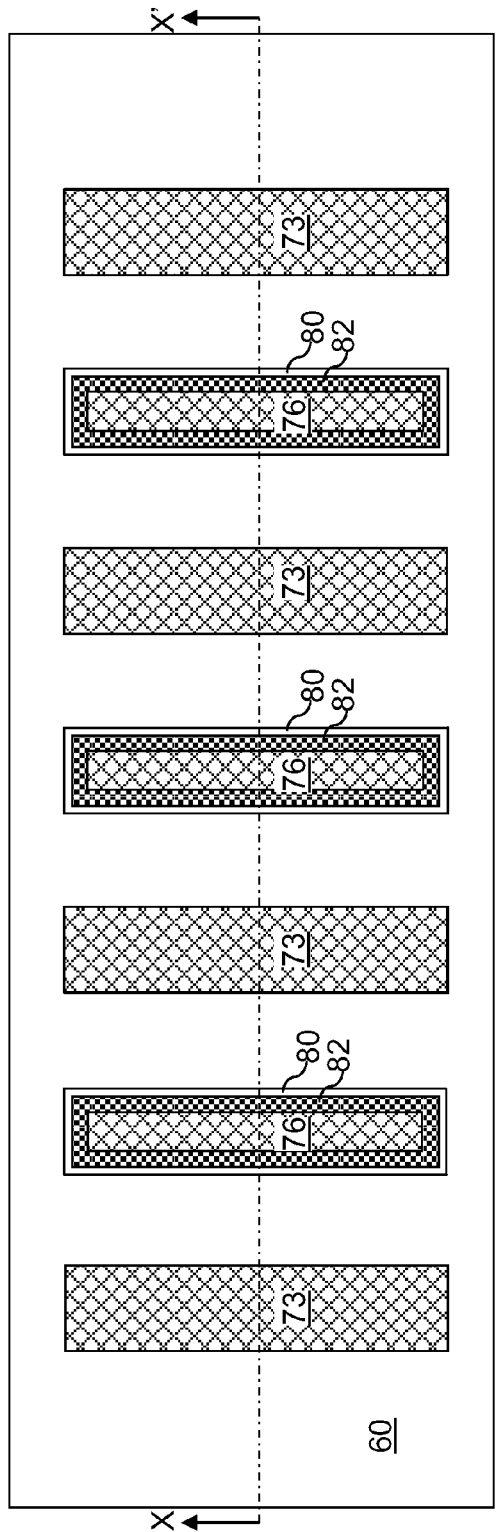
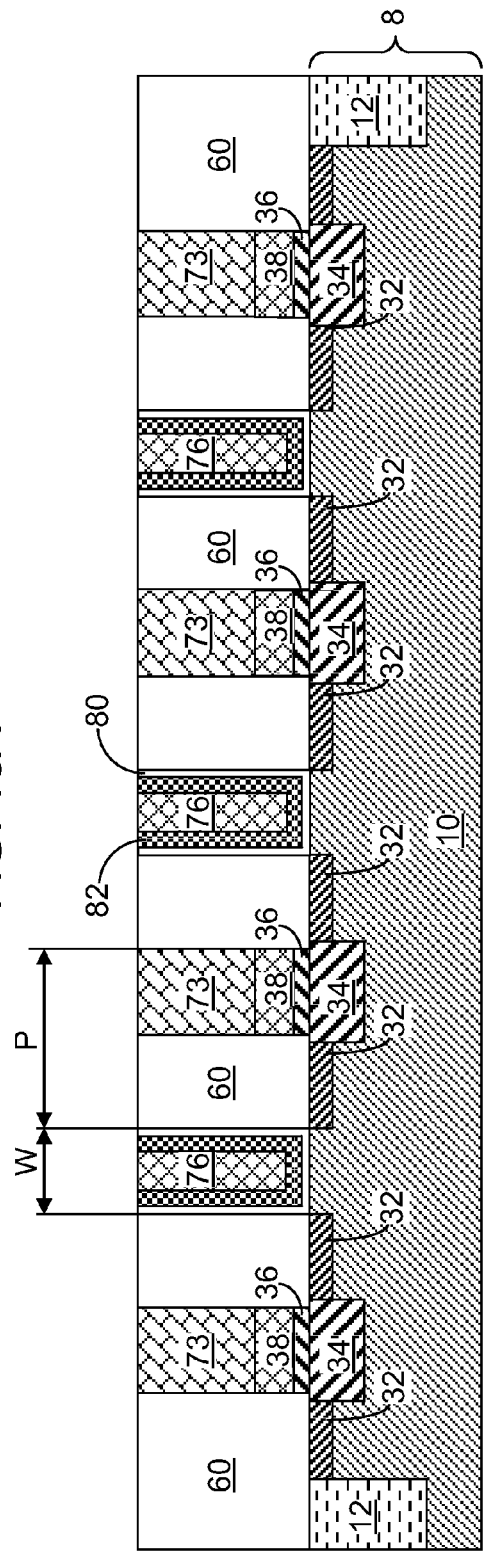

LOCAL INTERCONNECT STRUCTURE SELF-ALIGNED TO GATE STRUCTURE

BACKGROUND

The present disclosure relates to a semiconductor structure including local interconnect structures self-aligned to gate structures and methods of manufacturing the same.

As the transistor dimensions shrink, it becomes more critical to form different device elements with accurate overlay. Especially, it is very critical to form the contacts with accurate overlay to avoid possible short or opens. Self-aligned contact formation has been proposed to address this requirement. In conventional self-aligned contact schemes, at least two separate masks are needed to define the separate patterns for gate structures and local interconnect structures. Thus, the alignment of local interconnect structures to gate structures is subject to inherent non-zero overlay variations in conventional self-alignment schemes.

For static random access memory (SRAM) devices, conventional SRAM cells use L-shaped contact structures to minimize the area. However, as the dimensions are scaled down, it becomes more difficult to print such structures. In the state-of-the-art manufacturing processes currently employed, multiple exposures are required to form the L-shaped structure. Moreover, the irregular shape of the L-shaped structure prevents use of sidewall image transfer (SIT) or directional self-assembly that are more suited to future technology nodes than conventional lithography.

BRIEF SUMMARY

A common patterning step is employed to define a gate pattern and a local interconnect pattern so that local interconnect structures and gate structures are formed with zero overlay variation relative to one another. Preferably the gate and local interconnect patterns are defined with a process that forms parallel lines with a constant spacing and then a cut mask and lithography step is used to remove the unwanted potions of the parallel lines. Methods such as sidewall image transfer (SIT) or directional self-assembly are well-suited for forming such parallel lines. A local interconnect structure may be laterally spaced from a gate structure in a first horizontal direction, and contact another gate structure in a second horizontal direction that is different from the first horizontal direction. Further, a gate structure may be formed to be collinear with a local interconnect structure that adjoins the gate structure. The local interconnect structures and the gate structures are formed by a common damascene processing step so that the top surfaces of the gate structures and the local interconnect structures are coplanar with each other.

According to an aspect of the present disclosure, a semiconductor structure is provided, which includes a plurality of parallel conductive-material-including structures having parallel sidewalls and located on a semiconductor substrate and having a constant pitch in a horizontal direction perpendicular to the parallel sidewalls. One of the plurality of parallel conductive-material-including structures includes a metallic gate conductor electrode portion that includes a metallic material, and another of the plurality of parallel conductive-material-including structures includes a contact via structure that includes the metallic material and conductively connected to one of a source region and a drain region of a transistor located on the semiconductor substrate.

According to another aspect of the present disclosure, a static random access memory (SRAM) cell is provided. The SRAM cell includes a plurality of parallel conductive-material-including structures having parallel sidewalls and located on a semiconductor substrate and having a constant pitch in a horizontal direction perpendicular to the parallel sidewalls. One of the plurality of parallel conductive-material-including structures includes a metallic gate conductor electrode portion, which includes a metallic material. Another of the plurality of parallel conductive-material-including structures includes a contact via structure, which includes the metallic material and is conductively connected to one of a source region and a drain region of a transistor located on the semiconductor substrate. The plurality of parallel conductive-material-including structures is arranged in five rows at the constant pitch. Two of the five rows includes a structure that overlies four active regions. That structure includes a gate conductor electrode and a contact via structure that are conductively connected to each other and are of integral construction (i.e., a single contiguous piece).

According to yet another aspect of the present disclosure, a method of forming a semiconductor structure is provided, which includes: forming a plurality of at least partly disposable structures having parallel sidewalls on a semiconductor substrate, the plurality of at least partly disposable structures having a constant pitch in a horizontal direction perpendicular to the parallel sidewalls; forming and planarizing a dielectric material layer, wherein a top surface of the planarized dielectric material layer is coplanar with top surfaces of the plurality of at least partly disposable structures; forming a metallic gate conductor electrode portion by replacing a first portion of the plurality of at least partly disposable structures with a metallic material; and forming a contact via structure by replacing a second portion of the plurality of at least partly disposable structures with the metallic material, wherein the contact via structure is conductively connected to one of a source region and a drain region of a transistor located on the semiconductor substrate.

According to still another aspect of the present disclosure, a method of forming a semiconductor structure including a static random access memory (SRAM) cell is provided. The method includes: forming a plurality of at least partly disposable structures having parallel sidewalls on a semiconductor substrate, the plurality of at least partly disposable structures having a constant pitch in a horizontal direction perpendicular to the parallel sidewalls; forming and planarizing a dielectric material layer, wherein a top surface of the planarized dielectric material layer is coplanar with top surfaces of the plurality of at least partly disposable structures; forming a metallic gate conductor electrode portion by substituting a first portion of the plurality of at least partly disposable structures with a metallic material; and forming a contact via structure including the metallic material by substituting a second portion of the plurality of at least partly disposable structures. The contact via structure is conductively connected to one of a source region and a drain region of a transistor located on the semiconductor substrate. Multiple parallel conductive-material-including structures arranged in five rows at the constant pitch are formed. Two of the five rows includes a structure that overlies four active regions. The structure includes a gate conductor electrode and a contact via structure that are conductively connected to each other and are of integral construction. The multiple parallel conductive-material-including structures function as gate electrodes and local interconnect structures of an SRAM cell.

BRIEF DESCRIPTION OF THE SEVERAL VIEWS OF THE DRAWINGS

In FIGS. 1A-16B, figures with the same numeric prefix correspond to the same processing step. Figures with the suffix "A" are top-down views, and figures with the suffix "B" are vertical cross-sectional views along the vertical plane X-X' in the figure with the same numeric prefix and the suffix "A."

FIGS. 1A and 1B illustrate a first exemplary semiconductor structure after formation of a plurality of at least partly disposable structures according to a first embodiment of the present disclosure.

FIGS. 2A and 2B illustrate the first exemplary semiconductor structure after patterning the plurality of at least partly disposable structures employing a cut mask and an etch according to the first embodiment of the present disclosure.

FIGS. 3A and 3B illustrate the first exemplary semiconductor structure after removal of a patterned photoresist according to the first embodiment of the present disclosure.

FIGS. 4A and 4B illustrate the first exemplary semiconductor structure after formation of source and drain extension regions according to the first embodiment of the present disclosure.

FIGS. 5A and 5B illustrate the first exemplary semiconductor structure after forming and planarizing a contact-level dielectric material layer according to the first embodiment of the present disclosure.

FIGS. 7A and 7B illustrate the first exemplary semiconductor structure after formation of source and drain regions and raised source/drain regions according to the first embodiment of the present disclosure.

FIGS. 8A and 8B illustrate the first exemplary semiconductor structure after partial removal of a first group among the plurality of at least partly disposable structures and formation of gate metal-semiconductor-alloy portions and contact metal-semiconductor-alloy portions according to the first embodiment of the present disclosure.

FIGS. 9A and 9B illustrate the first exemplary semiconductor structure after formation of a plurality of parallel conductive-material-including structures according to the first embodiment of the present disclosure.

FIGS. 10A and 10B illustrate a second exemplary semiconductor structure after removing a group among the plurality of at least partly disposable structures to form cavities according to a second embodiment of the present disclosure.

FIGS. 12A and 12B illustrate the second exemplary semiconductor structure after removing another group among the plurality of at least partly disposable structures to form additional cavities according to the second embodiment of the present disclosure.

FIGS. 13A and 13B illustrate the second exemplary semiconductor structure after formation of source and drain regions according to the second embodiment of the present disclosure.

FIGS. 14A and 14B illustrate the second exemplary semiconductor structure after formation of raised source/drain regions according to the second embodiment of the present disclosure.

FIGS. 15A and 15B illustrate the second exemplary semiconductor structure after formation of contact metal-semiconductor-alloy portions according to the second embodiment of the present disclosure.

FIGS. 16A and 16B illustrate the second exemplary semiconductor structure after formation of a plurality of parallel conductive-material-including structures according to the second embodiment of the present disclosure.

DETAILED DESCRIPTION

Figure 6A:
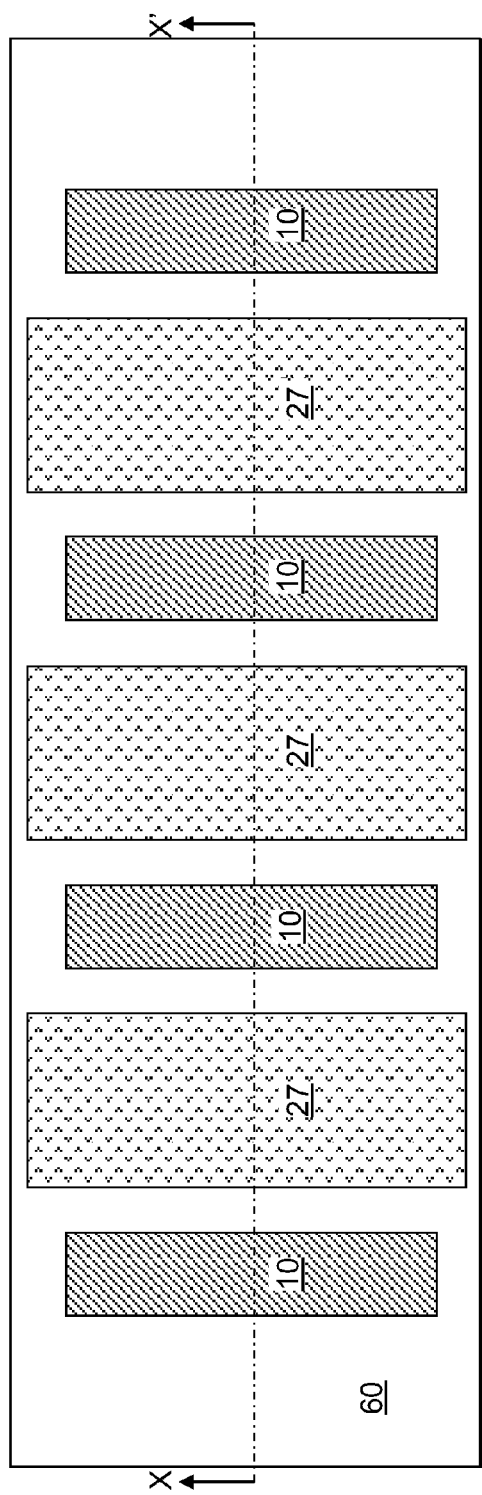
FIGS. 6A and 6B illustrate the first exemplary semiconductor structure after removing a second group among the plurality of at least partly disposable structures to form first cavities according to the first embodiment of the present disclosure.

As stated above, the present disclosure relates to a semiconductor structure including local interconnect structures self-aligned to gate structures and methods of manufacturing the same, which are now described in detail with accompanying figures. It is noted that like and corresponding elements mentioned herein and illustrated in the drawings are referred to by like reference numerals.

Referring to FIGS. 1A and 1B, a first exemplary semiconductor structure includes a semiconductor substrate 8 including a semiconductor layer 10 and shallow trench isolation regions 12 therein. The semiconductor layer 10 includes a semiconductor material such as silicon, a silicon containing alloy, a germanium containing alloy, a III-V compound semiconductor, or a II-IV semiconductor. Preferably, the entirety of the semiconductor layer 10 is single crystalline. The semiconductor substrate 8 may be a bulk substrate, a semiconductor-on-insulator (SOI) substrate, or a hybrid substrate including a bulk portion and an SOI portion. If the semiconductor substrate 8 is an SOI substrate or a hybrid substrate, the semiconductor substrate 8 includes a buried insulator layer (not shown) or a buried insulator portion (not shown) that is located on a bottom surface of the shallow trench isolation structures 12, and the semiconductor layer 10 may be vertically confined between the top surfaces and the bottom surfaces of the isolation structures 20.

A partly disposable material stack is formed on the surface of the semiconductor substrate 10. The partly disposable material stack can include a stack, from bottom to top, of a gate dielectric layer, a gate electrode layer, and a dielectric gate cap layer. For example, the gate dielectric layer can include silicon oxide or another dielectric material that can be etched selective to the semiconductor material of the semiconductor layer 10. The thickness of the gate dielectric layer can be from 1 nm to 30 nm, and typically from 1 nm to 5 nm, although lesser and greater thicknesses can also be employed. The gate electrode layer can include polysilicon or a silicon-containing semiconductor alloy such as a silicon-germanium alloy. Alternatively, the gate electrode layer can include a metal layer such as TiN, TaN, W, or a combination of these material and an optional polysilicon or silicon-containing semiconductor overlaying the metal layer. The thickness of the gate electrode layer can be from 20 nm to 200 nm, and typically from 20 nm to 100 nm, although lesser and greater thicknesses can also be employed. The dielectric gate cap layer can include a dielectric material such as silicon nitride, silicon oxide, silicon oxynitride, or a combination thereof. The thickness of the dielectric gate cap layer can be from 10 nm to 300 nm, and typically from 30 nm to 150 nm, although lesser and greater thicknesses can also be employed.

The partly disposable material stack is patterned to form a plurality of at least partly disposable structures. Each of the at least partly disposable structures includes a stack, from bottom to top, of a remaining portion of the gate dielectric layer, a remaining portion of the gate electrode layer, and a remaining portion of the dielectric gate cap layer.

The plurality of at least partly disposable structures can be classified into three groups. A first group includes at least partly disposable structures that are subsequently at least partly replaced with replacement materials to form gate electrodes. A second group includes at least partly disposable structures that are subsequently at least partly replaced with replacement materials to form contact via structures. A third group includes at least partly disposable structures that are not employed to form either gate electrodes or contact via structures. Thus, the plurality of at least partly disposable structures includes patterns to be employed for formation of gate electrodes and contact via structures. While each of the at least partly disposable structures illustrated in FIGS. 1A and 1B is shown as a distinct structure that does not adjoin any other at least partly disposable structure, different portions of the same contiguous at least partly disposable structure can be employed for formation of gate electrodes and contact via structures in some embodiment. In such embodiment, a first portion of a single at least partly disposable structure can belong to the first group, and a second portion of the same single at least one partly disposable structure can belong to the second group.

Each at least partly disposable structure in the first group includes a vertical stack of a gate dielectric 50A, a gate electrode portion 52A, and a dielectric gate cap 54A. Each at least partly disposable structure in the second group includes a vertical stack of a disposable dielectric portion 50B, a disposable electrode portion 52B, and a disposable dielectric cap portion 54B. Each at least one part disposable structure in the third group includes a vertical stack of a dummy dielectric portion 50C, a dummy electrode portion 52C, and a dummy dielectric cap portion 54C.

The plurality of at least partly disposable structures have parallel sidewalls, which are in the vertical direction within the plane including FIG. 1A (i.e., within the plane of the paper or the electronic display screen showing FIG. 1A) and in the horizontal direction perpendicular to the plane including FIG. 1B. The plurality of at least partly disposable structures has a constant pitch P in a horizontal direction perpendicular to the parallel sidewalls. As used herein, multiple components of a structure has a "constant pitch" if there exists a region in which the multiple components are periodic in one direction and the periodicity is invariant, i.e., constant, under translation in a direction perpendicular to the direction of the periodicity. A sidewall of one of a gate dielectric 50A, a disposable dielectric portion 50B, and a dummy dielectric portion 50C, a sidewall of one of a gate electrode portion 52A, a disposable electrode portion 52B, a dummy electrode portion 52C, and a sidewall of one of a dielectric gate cap 54A, a disposable dielectric cap portion 54B, and a dummy dielectric cap portion 54C are present within each of the parallel sidewalls of the plurality of at least partly disposable structures. Each of the plurality of at least partly disposable structures has a constant width W in the direction of the constant pitch P. As used herein, multiple components of a structure has a "constant width" if there exists a region in which each of the multiple components has the same width irrespective of selection of a component to be measured and irrespective of the location selected for measurement. Because the plurality of at least partly disposable structures has the same constant pitch P and each of the plurality of at least partly disposable structures has the same width W, each of the plurality of at least partly disposable structures are self-aligned to one another in a one-dimensional array.

The patterning of the plurality of at least partly disposable structures can be effected employing any method known in the art for patterning a one-dimensional periodic structure. For example, conventional diffraction lithography for printing a one-dimensional periodic array of lines can be employed in combination with an anisotropic etch. Alternately, directional self-assembly and subsequent pattern transfer by an anisotropic etch can also be employed. Yet alternately, a sidewall image transfer (SIT) process or any other equivalent process known in the art can also be employed. The plurality of at least partly disposable structures is typically formed as tightly packed periodic parallel lines having a lineal density higher than what is achievable with conventional lithography for random patterns.

Referring to FIGS. 2A and 2B, a first photoresist 17 is applied to the top surface of the first exemplary semiconductor structure of FIGS. 1A and 1B, and is lithographically patterned to define areas in the plurality of at least partly disposable structures to be protected. The portions of the plurality of at least partly disposable structures that are not protected by the patterned first photoresist 17 are removed by an anisotropic etch. The patterned first photoresist 17 is employed as an etch mask for the anisotropic etch. The mask employed to pattern the first photoresist 17 is referred to as a "cut mask" because the portions of the plurality of at least partly disposable structures that are not protected by the first photoresist 17 are removed by an anisotropic etch such as a reactive ion etch, and the remaining portions of the plurality of at least partly disposable structures appear to have been "cut" into many portions from the original plurality of at least partly disposable structures. The at least partly disposable structures in the first and second group are partially removed, and the at least one partly disposable structures in the third group are entirely removed. The first photoresist 17 is subsequently removed, for example, by ashing.

Referring to FIGS. 3A and 3B, the patterned first photoresist 17 is removed, for example, by ashing, from the first exemplary semiconductor structure. The composite pattern obtained by performing a logical "AND" operation on the one-dimensional pattern of the original plurality of at least partly disposable structures as provided in FIGS. 1A and 1B and the pattern in the cut mask includes the pattern for gate electrodes and the pattern for contact via structures. In other words, the remaining portions of the plurality of at least partly disposable structures after the processing step of FIGS. 2A and 2B include two patterns. One is the pattern for gate electrodes, and the other is the pattern for contact via structures. In some cases, a combination of multiple cut masks may be substituted for a single cut mask.

Referring to FIGS. 4A and 4B, source and drain extension regions 32 are formed, for example, by ion implantation and/or plasma doping and/or gas phase doping. Halo regions (not shown) can also be formed as needed. If dopants of different conductivity types (e.g., p-type and n-type) need to be implanted to form different types of field effect transistors, block masks (not shown) can be optionally employed. The block masks can be patterned photoresists that covers regions in which implantation of ions is not desired.

Referring to FIGS. 5A and 5B, a contact-level dielectric material layer 60 is deposited and subsequently planarized. The contact-level dielectric material layer 60 includes a dielectric material such as undoped silicate glass or silicate glass. Preferably, the contact-level dielectric material layer 60 is deposited as a conformal layer to avoid formation of voids at seams. For example, the contact-level dielectric material layer 60 can be deposited by low pressure chemical vapor deposition (LPCVD), sub-atmospheric chemical vapor deposition (SACVD), high density plasma chemical vapor deposition (HDPCVD), or spin coating. The contact-level dielectric material layer 60 is subsequently planarized employing the top surfaces of the dielectric gate caps 54A and the disposable dielectric cap portions 54B as a stopping layer. Thus, the top surface of the planarized contact-level dielectric material layer 60 is coplanar with top surfaces of the plurality of at least partly disposable structures.

Figure 6B:
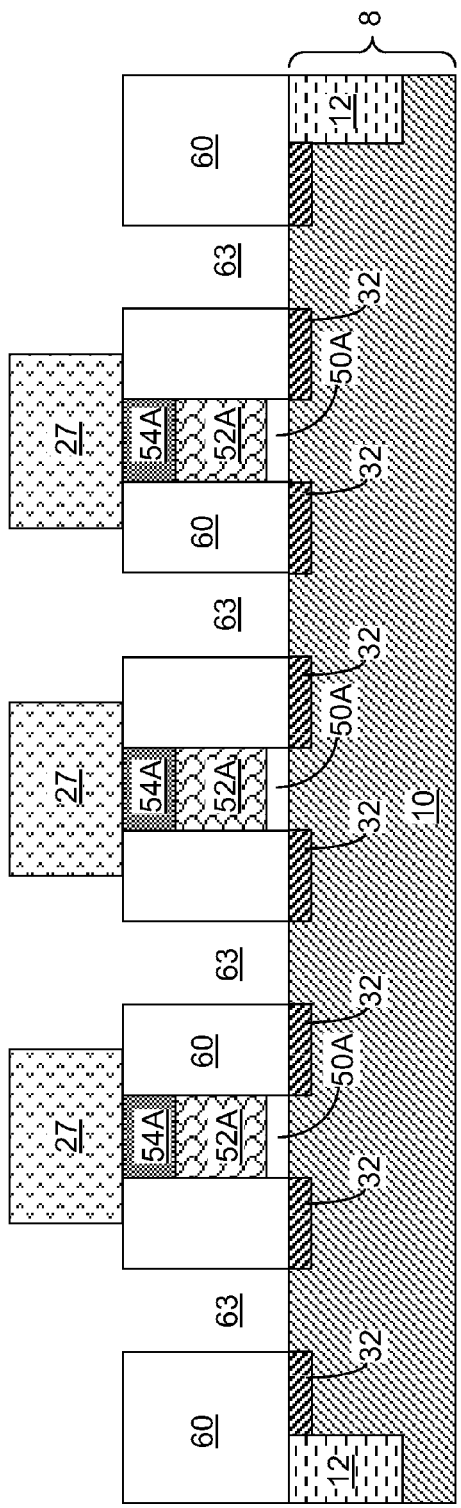

Referring to FIGS. 6A and 6B, a second photoresist 27 is applied to the top surfaces of the first exemplary semiconductor structure and is lithographically patterned to cover the first group of the plurality of at least partly disposable structures, i.e., the at least partly disposable structures including a vertical stack of a gate dielectric 50A, a gate electrode portion 52A, and a dielectric gate cap 54A. Thus, the second group of the plurality of at least partly disposable structures is exposed outside the areas of the patterned second photoresist 27. An anisotropic etch is performed employing the combination of the second photoresist 27 and the contact-level dielectric material layer 60 as an etch mask to remove the second group of the plurality of at least partly disposable structures, i.e., the at least partly disposable structures including a vertical stack of a disposable dielectric portion 50B, a disposable electrode portion 52B, and a disposable dielectric cap portion 54B.

Contact cavities 63 are formed in the volume from which the second group of the plurality of at least partly disposable structures is completely removed. The top surface of the semiconductor layer 10 is exposed within each contact cavity 63. The second photoresist 27 is subsequently removed, for example, by ashing.

Referring to FIGS. 7A and 7B, source and drain regions 34 can be formed by ion implantation. Optionally, raised source/drain regions 36 can be formed by selective epitaxy, which deposits a semiconductor material only on semiconductor surfaces, but not on dielectric surfaces such as the surfaces of the dielectric gate caps 54A and the contact-level dielectric material layer 60.

Referring to FIGS. 8A and 8B, contact metal-semiconductor-alloy portions 38 can be optionally formed, for example, by depositing a metal layer (not shown), inducing formation of the contact metal-semiconductor alloy portions 38 at an elevated temperature exceeding 300 degrees Celsius, and removing any unreacted portions of the metal layer.

If formation of gate metal-semiconductor-alloy portions 58 is desired, upper portions of the first group of the plurality of at least partly disposable structures are removed to expose a semiconductor material within the first group of the plurality of at least partly disposable structures before depositing the metal layer employed to form the contact metal-semiconductor alloy portions 38. Specifically, the dielectric gate caps 54A can be removed selective to the contact-level dielectric material layer 60 and the semiconductor material below the contact cavities 63 to expose top surfaces of the semiconductor gate electrode portions 52A. The metal layer is simultaneously deposited on the raised source/drain regions 36 (if present) or source and drain regions 34 (if raised source/drain regions 36 are not present) and on the top surfaces of the semiconductor gate electrode portions 52A. After an anneal and removal of unreacted portions of the metal layer, the contact metal-semiconductor alloy portions 38 and the gate metal-semiconductor-alloy portions 58 are formed. The top surfaces of the contact metal-semiconductor alloy portions 38 and the gate metal-semiconductor-alloy portions 58 are recessed relative to the top surface of the contact-level dielectric material layer 60. The cavities above the gate metal-semiconductor-alloy portions 58 (if present) or above the gate electrode portions 52A (if gate metal-semiconductor-alloy portions are not present) are herein referred to as gate cavities 83.

Referring to FIGS. 9A and 9B, a metallic material is deposited and planarized to fill the gate cavities 83 and the contact cavities 63. A metallic gate conductor electrode portion 75 fills each gate cavity 83, and a contact via structure 73 fills each contact cavity 63. The metallic gate conductor electrode portions 75 provide gate metallization, and the contact via structures 73 provide electrical contact to the source and drain regions 34 and local interconnection embedded within the contact-level dielectric material layer 60.

The metallic gate conductor electrode portions 75 are formed by replacing a first portion of the plurality of at least partly disposable structures, i.e., a portion of the first group among the plurality of at least partly disposable structures, with the metallic material. The first group among the plurality of at least partly disposable structures, as provided at the processing step of FIGS. 3A and 3B, is replaced only partially. Thus, a subset of the plurality of at least partly disposable structures remains on the semiconductor substrate 8 after formation of the metallic gate conductor electrode portions 75 and the contact via structures 73. Specifically, the subset of the at least partly disposable structures includes the gate dielectrics 50A, and gate electrode portions 52A.

The contact via structures 73 are formed by replacing a second portion of the plurality of at least partly disposable structures, i.e., a portion of the second group among the plurality of at least partly disposable structures, with the metallic material. The second group among the plurality of at least partly disposable structures, as provided at the processing step of FIGS. 3A and 3B, is replaced completely. At least one of the contact via structures 73 can be conductively connected to one of a source region and a drain region of a transistor located on the semiconductor substrate 8. As used herein, a first element is "conductively connected" to a second element if there exists an electrically conductive path between the first element and the second element.

The metallic gate conductor electrode portions 75 and the contact via structures 73 are formed simultaneously by depositing the metallic material within cavities formed after removal of at least a portion of the plurality of at least partly disposable structures. Each gate metal-semiconductor-alloy portion 58, if present, contacts a bottom surface of a metallic gate conductor electrode portion 75, and each contact metal-semiconductor-alloy portion 38 contacts a bottom surface of a contact via structure 73. Further, each contact metal-semiconductor-alloy portion 38 has the same width W as the gate metal-semiconductor-alloy portions 58.

A first type of conductive-material-including structures includes vertical stacks of a gate dielectric 50A, a gate electrode portion 52A, an optional gate metal-semiconductor-alloy portions 58 (if present), and a metallic gate conductor electrode portion 75. A second type of conductive-material-including structures includes contact via structures 73 and contact metal-semiconductor alloy portions 38 (if raised source/drain regions 36 are not present) or a vertical stacks including a contact via structure 73, contact metal-semiconductor alloy portions 38, and raised source/drain regions 36.

The first type of conductive-material-including structures and the second type of conductive-material-including structures collectively constitute a plurality of parallel conductive-material-including structures (50A, 52A, 58, 75, 36, 38, 73), which is formed by substituting metallic material portions for a fraction of the plurality of at least partly disposable structures as provided in FIGS. 3A and 3B. The plurality of parallel conductive-material-including structures (50A, 52A, 58, 75, 36, 38, 73) has additional parallel sidewalls, which are sidewalls of the metallic gate conductor electrode portions 75 and the contact via structures 73. The plurality of parallel conductive-material-including structures (50A, 52A, 58, 75, 36, 38, 73) has the constant pitch P in the horizontal direction perpendicular to the parallel sidewalls. Each first type conductive-material-including structure includes a gate dielectric 50A and a metallic gate conductor electrode portion 75, and the lateral distance between a sidewall of the metallic gate conductor electrode portion 75 and a sidewall of a neighboring contact via structure 73 is equal to the constant pitch P. Each of the plurality of parallel conductive-material-including structures (50A, 52A, 58, 75, 36, 38, 73) has the constant width W in the direction of the constant pitch P.

Each metallic gate conductor electrode portion 75 is a portion of a gate conductor electrode of a transistor. One of the contact via structures 73 can be laterally spaced from a metallic gate conductor electrode portion 75 by a distance (P-W) and contact one of the source region and the drain region of the transistor, and another of the contact via structures 73 can be laterally spaced from the metallic gate conductor electrode portion 75 by a distance (P-W) and contact the other of the source region and the drain region of the transistor.

Referring to FIGS. 10A and 10B, a second exemplary semiconductor structure is derived from the first exemplary semiconductor structure of FIGS. 5A and 5B by applying a contact-blocking photoresist 37 to the top surface of the contact-level dielectric material layer 60 and lithographically patterning to cover the second group of the plurality of at least partly disposable structures, i.e., the at least partly disposable structures including a vertical stack of a disposable dielectric portion 50B, a disposable electrode portion 52B, and a disposable dielectric cap portion 54B. Thus, the first group of the plurality of at least partly disposable structures is exposed outside the areas of the patterned contact-blocking photoresist 37. An anisotropic etch is performed employing the combination of the patterned contact-blocking photoresist 37 and the contact-level dielectric material layer 60 as an etch mask to remove the first group of the plurality of at least partly disposable structures, i.e., the at least partly disposable structures including a gate dielectric 50A, a gate electrode portion 52A, and a dielectric gate cap 54A.

Gate cavities 83 are formed in the volume from which the first group of the plurality of at least partly disposable structures is completely removed. The top surface of the semiconductor layer 10 is exposed within each gate cavity 83. The contact-blocking photoresist 37 is subsequently removed, for example, by ashing.

Figure 11A:
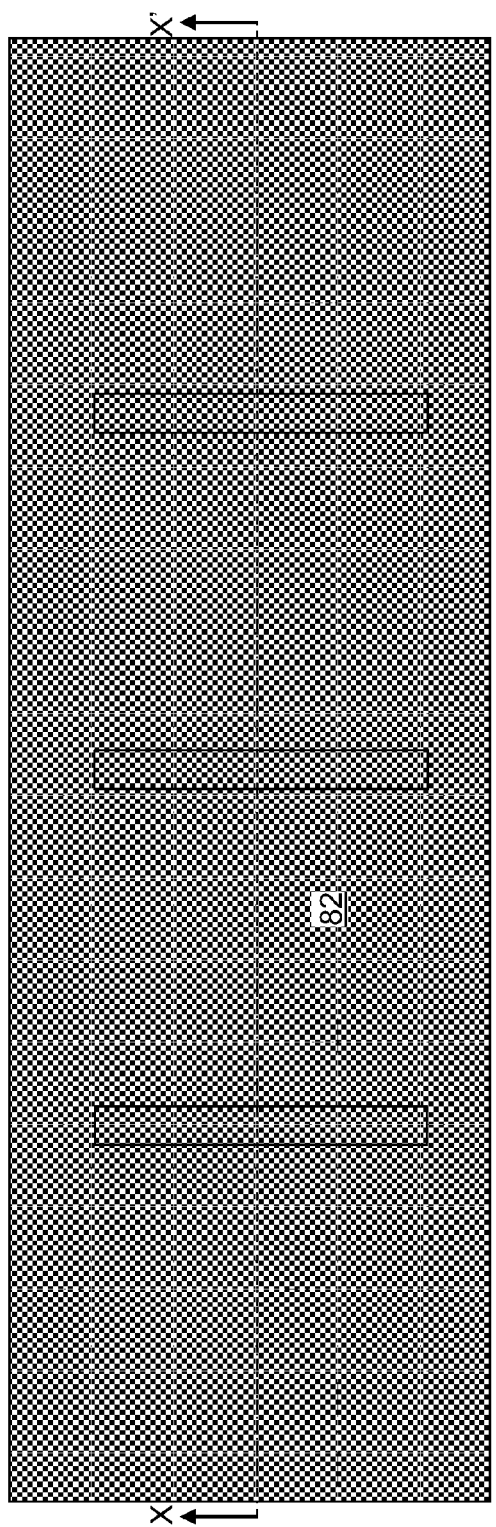
FIGS. 11A and 11B illustrate the second exemplary semiconductor structure after formation of a gate dielectric layer and a workfunction metal layer according to the second embodiment of the present disclosure.
Figure 11B:
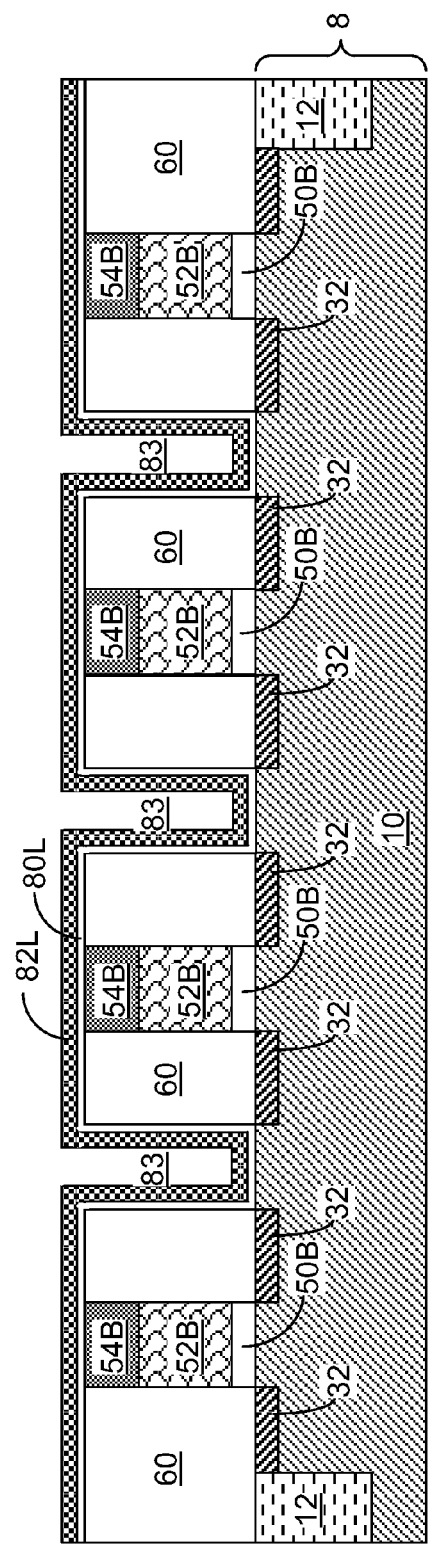

Referring to FIGS. 11A and 11B, a gate dielectric layer 80L and a workfunction metal layer 82L are sequentially deposited within the gate cavities 83 and over the contact-level dielectric material layer 60. The gate dielectric layer 80L can be a continuous material layer that continuously covers, without a hole therein, the entirety of exposed surfaces of the semiconductor layer 10, the sidewalls and top surfaces of the contact-level dielectric material layer 60, and the disposable dielectric cap portions 54B. The gate dielectric layer 80L can be formed by a conformal or non-conformal deposition of a dielectric material. Within each gate cavity 83, the gate dielectric layer 80L includes a U-shaped gate dielectric portion that contiguously extends from the top surface of the semiconductor substrate 8 to the top surface of the contact-level dielectric material layer 60 along the vertical sidewalls of the contact-level dielectric material layer 60. For example, the gate dielectric layer 80L can be composed of a high dielectric constant (high-k) dielectric material including a dielectric metal oxide and having a dielectric constant greater than 8.0. The high-k dielectric material may be formed by methods well known in the art.

The workfunction metal layer 82L can include any metallic material that can adjust the threshold voltages of transistors to be formed. For example, the workfunction metal layer 82L can include metals such as Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, W, Ta, TiN, and alloys thereof. In some embodiments, multiple workfunction metal layers 82 may be employed with optional lithographic patterning to provide different types of transistors having different threshold voltages.

Referring to FIGS. 12A and 12B, a gate-blocking photoresist 47 is applied to the top surfaces of the second exemplary semiconductor structure and is lithographically patterned to cover the regions of the gate cavities 83 and portions of the workfunction metal layer 82L thereabout. Thus, the second group of the plurality of at least partly disposable structures is exposed outside the areas of the patterned gate-blocking photoresist 47.

The exposed portions of the workfunction metal layer 82L and the gate dielectric layer 80L are etched, for example, by a wet etch or an anisotropic etch. The remaining portions of the workfunction metal layer 82L and the gate dielectric layer 80L form a stack of a gate dielectric 80 and a workfunction metal layer 82 underneath each isolated portion of the patterned gate-blocking photoresist 47.

An anisotropic etch is performed employing the combination of the patterned gate-blocking photoresist 47 and the contact-level dielectric material layer 60 as an etch mask to remove the second group of the plurality of at least partly disposable structures, i.e., the at least partly disposable structures including a vertical stack of a disposable dielectric portion 50B, a disposable electrode portion 52B, and a disposable dielectric cap portion 54B. Contact cavities 63 are formed in the volume from which the second group of the plurality of at least partly disposable structures is completely removed. The top surface of the semiconductor layer 10 is exposed within each contact cavity 63. In the second embodiment, the entirety of the plurality of at least partly disposable structures, as provided in FIGS. 3A and 3B, is removed by the end of this step.

Referring to FIGS. 13A and 13B, source and drain regions 34 can be formed by ion implantation. The gate-blocking photoresist 47 is subsequently removed, for example, by ashing.

Referring to FIGS. 14A and 14B, raised source/drain regions 36 can be optionally formed by selective epitaxy, which deposits a semiconductor material only on semiconductor surfaces, but not on dielectric surfaces such as the surfaces of the workfunction metal layers 82 and the contact-level dielectric material layer 60. This processing step is optional.

Referring to FIGS. 15A and 15B, contact metal-semiconductor-alloy portions 38 can be optionally formed, for example, by depositing a metal layer (not shown), inducing formation of the contact metal-semiconductor alloy portions 38 at an elevated temperature exceeding 300 degrees Celsius, and removing any unreacted portions of the metal layer. This processing step is optional.

Referring to FIGS. 16A and 16B, a metallic material is deposited and planarized to fill the gate cavities 83 and the contact cavities 63. A metallic gate conductor electrode portion 76 fills each gate cavity 83, and a contact via structure 73 fills each contact cavity 63. The metallic gate conductor electrode portions 76 provide gate metallization, and the contact via structures 73 provide electrical contact to the source and drain regions 34 and local interconnection embedded within the contact-level dielectric material layer 60.

The metallic gate conductor electrode portions 76 are formed by replacing a first portion of the plurality of at least partly disposable structures, i.e., a portion of the first group among the plurality of at least partly disposable structures, with the metallic material. The first group among the plurality of at least partly disposable structures, as provided at the processing step of FIGS. 3A and 3B, is replaced completely with a combination of gate dielectrics 80, the workfunction metal layers 82, and the metallic material constituting the metallic gate conductor electrode portions 76.

The contact via structures 73 are formed by replacing a second portion of the plurality of at least partly disposable structures, i.e., a portion of the second group among the plurality of at least partly disposable structures, with the metallic material. The second group among the plurality of at least partly disposable structures, as provided at the processing step of FIGS. 3A and 3B, is replaced completely with the contact via structures 72 and optionally with the raised source/drain regions 36 (if present) and/or the contact metal-semiconductor alloy portions 38 (if present). At least one of the contact via structures 73 can be conductively connected to one of a source region and a drain region of a transistor located on the semiconductor substrate 8.

The metallic gate conductor electrode portions 76 and the contact via structures 73 are formed simultaneously by depositing the metallic material within cavities formed after removal of at least a portion of the plurality of at least partly disposable structures. Each metallic gate conductor electrode portions 76 contacts inner sidewalls and an upper surface of the workfunction metal layers 82.

A first type of conductive-material-including structures includes a gate dielectric 80, which can be a U-shaped gate dielectric, a metallic gate conductor electrode portion 76, and a workfunction metal layer 82 contacting inner sidewalls and an upper surface of the U-shaped gate dielectric and outer sidewalls and a bottom surface of the metallic gate conductor electrode portion 76. A second type of conductive-material-including structures includes contact via structures 73 (if raised source/drain regions 36 are not present and contact metal-semiconductor alloy portions 38 are not present) or a vertical stacks including a contact via structure 73 and at least one of raised source/drain regions 36 and contact metal-semiconductor alloy portions 38.

The first type of conductive-material-including structures and the second type of conductive-material-including structures collectively constitute a plurality of parallel conductive-material-including structures (80, 82, 76, 36, 38, 73), which is formed by substituting metallic material portions for a fraction of the plurality of at least partly disposable structures as provided in FIGS. 3A and 3B. The plurality of parallel conductive-material-including structures (80, 82, 76, 36, 38, 73) has additional parallel sidewalls, which are sidewalls of gate dielectrics 80 and the contact via structures 73. The plurality of parallel conductive-material-including structures (80, 82, 76, 36, 38, 73) has the constant pitch P in the horizontal direction perpendicular to the parallel sidewalls. Each first type conductive-material-including structure includes a gate dielectric 80 and a metallic gate conductor electrode portion 76, and the lateral distance between an outer sidewall of the gate dielectric 80, i.e., a U-shaped gate dielectric, and a sidewall of a neighboring contact via structure 73 is equal to the constant pitch P. Each of the plurality of parallel conductive-material-including structures (80, 82, 76 or 36, 38, 73) has the constant width W in the direction of the constant pitch P. The plurality of parallel conductive-material-including structures (80, 82, 76 or 36, 38, 73) is formed by substituting metallic material portions for a fraction of the plurality of at least partly disposable structures.

Each metallic gate conductor electrode portion 76 is a portion of a gate conductor electrode of a transistor. One of the contact via structures 73 can be laterally spaced from a metallic gate conductor electrode portion 76 by a distance (P-W) and contact one of the source region and the drain region of the transistor, and another of the contact via structures 73 can be laterally spaced from the metallic gate conductor electrode portion 76 by a distance (P-W) and contact the other of the source region and the drain region of the transistor.

According to a third embodiment of the present disclosure, the structures and methods of first and second embodiments of the present disclosure can be embodied in new cell layouts for various semiconductor devices. For example, a static random access memory (SRAM) cell including multiple parallel conductive-material-including structures arranged in five rows at the constant pitch can be formed employing the structures and methods of the present disclosure. In the third embodiment, one of the plurality of parallel conductive-material-including structures can include both a first type of conductive-material-including structure and a second type of conductive-material-including structure in the first or second embodiments.

It is noted that, even if the processes described in the first and second embodiment are substituted by other processes, the SRAM cell layout described herein can be used to avoid L-shaped structure at local interconnect level so as to avoid adding multiple lithography steps.

Figure 17:
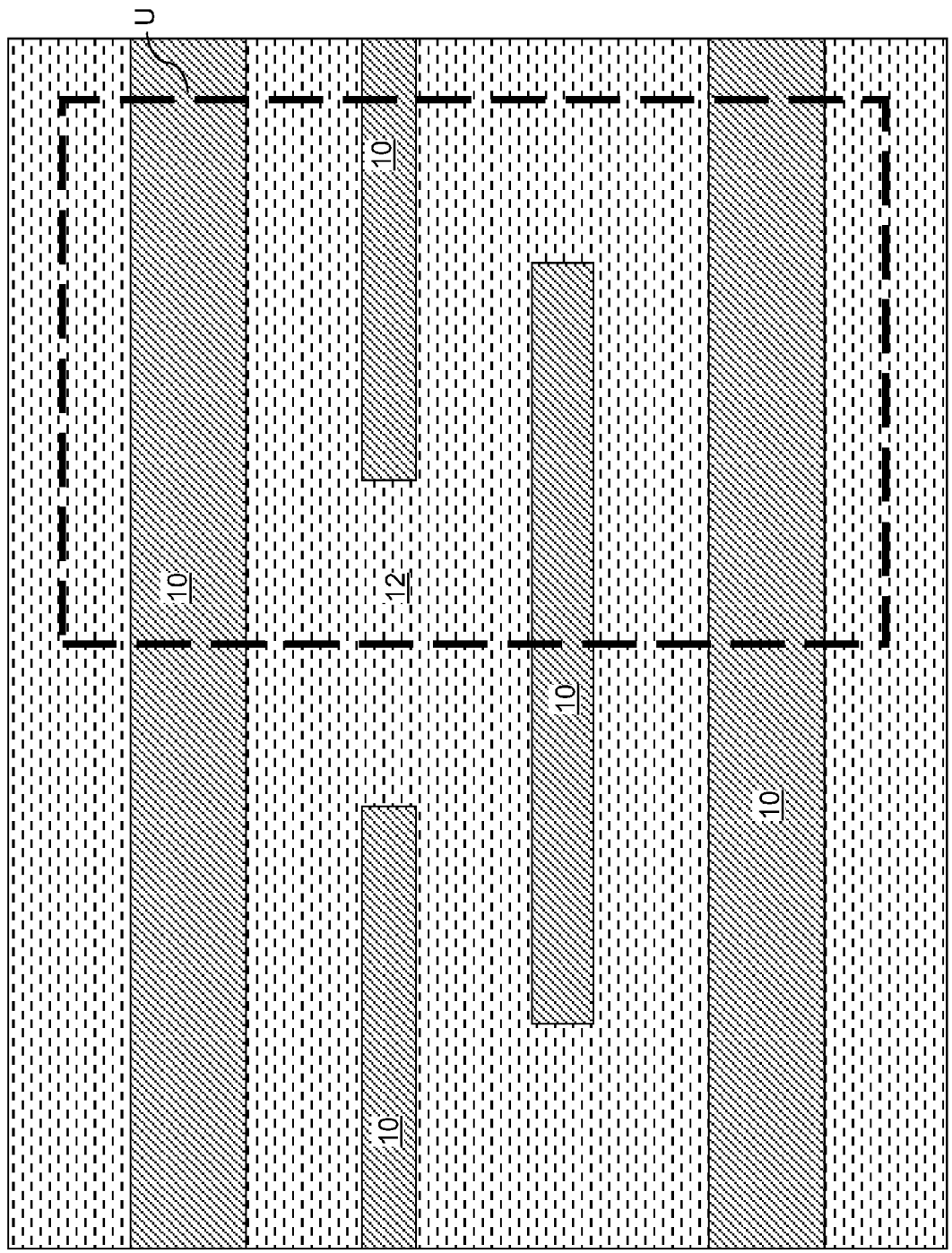
FIG. 17 is a top down view of a third exemplary semiconductor structure after patterning of active areas and shallow trench isolation structures according to a third embodiment of the present disclosure.

Referring to FIG. 17, a third exemplary semiconductor structure according to a third embodiment of the present disclosure includes shallow trench isolation structures 12 embedded in a semiconductor layer 10, which can be in a semiconductor substrate 8 (See FIG. 1B). The exposed regions of the semiconductor layer 10 are herein referred to as "active areas." The area for a unit cell U for an SRAM is marked by a dashed line.

Figure 18:
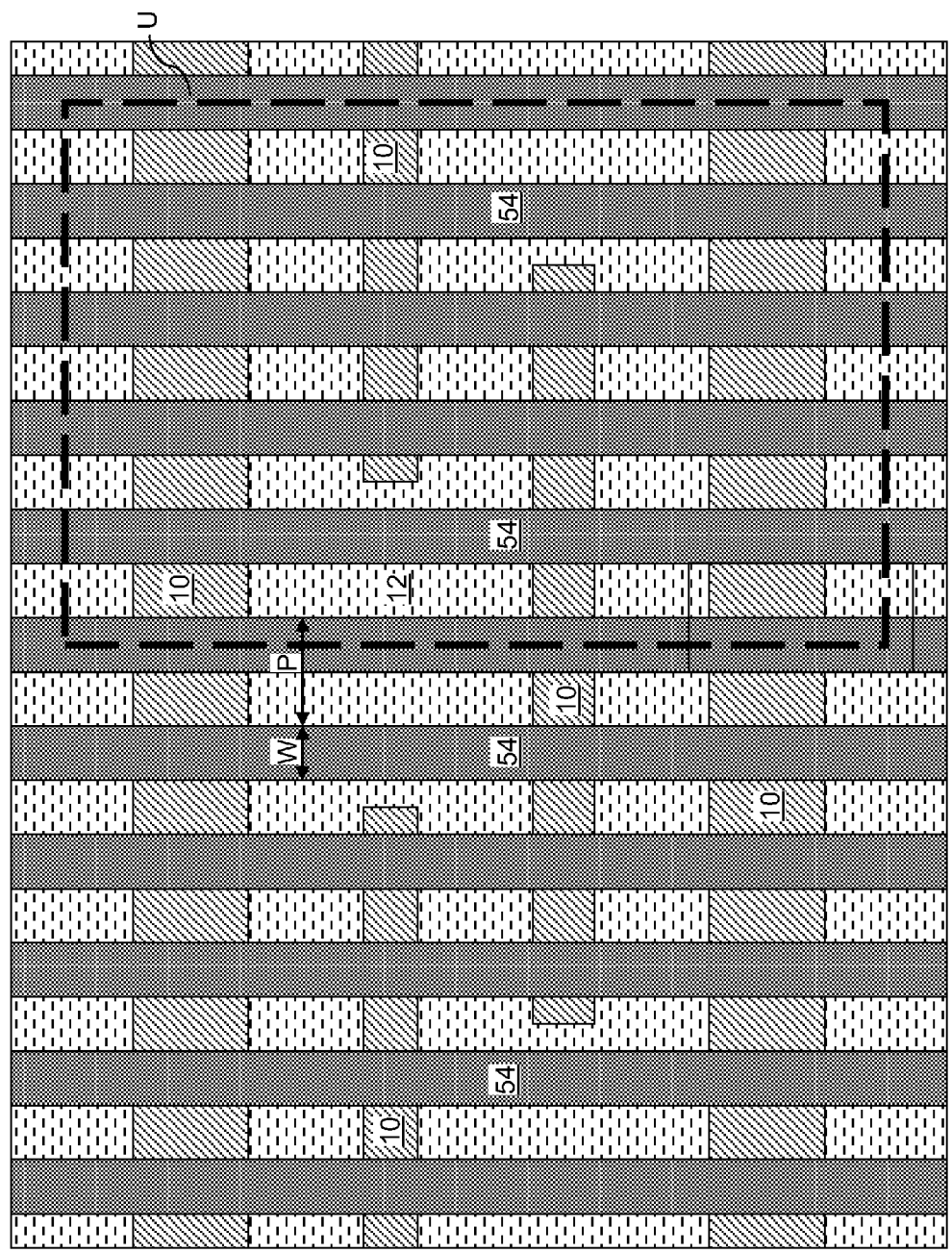
FIG. 18 is a top down view of the third exemplary semiconductor structure after formation of a plurality of at least partly disposable structures according to the third embodiment of the present disclosure.

Referring to FIG. 18, a plurality of at least partly disposable structures is formed on the semiconductor substrate employing the same methods as in the first embodiment. The plurality of at least partly disposable structures can be the same as described in FIGS. 1A and 1B. Dielectric caps 54 in FIG. 18 correspond to the collection of the dielectric gate caps 54A, the disposable dielectric cap portions 54B, and the dummy dielectric cap portions 54C in FIGS. 1A and 1B. The plurality of at least partly disposable structures has parallel sidewalls located on the semiconductor substrate. Further, the plurality of at least partly disposable structures has a constant pitch P in a horizontal direction perpendicular to the parallel sidewalls. Each of the plurality of at least partly disposable structures has a constant width W in the direction of the constant pitch P.

Figure 19:
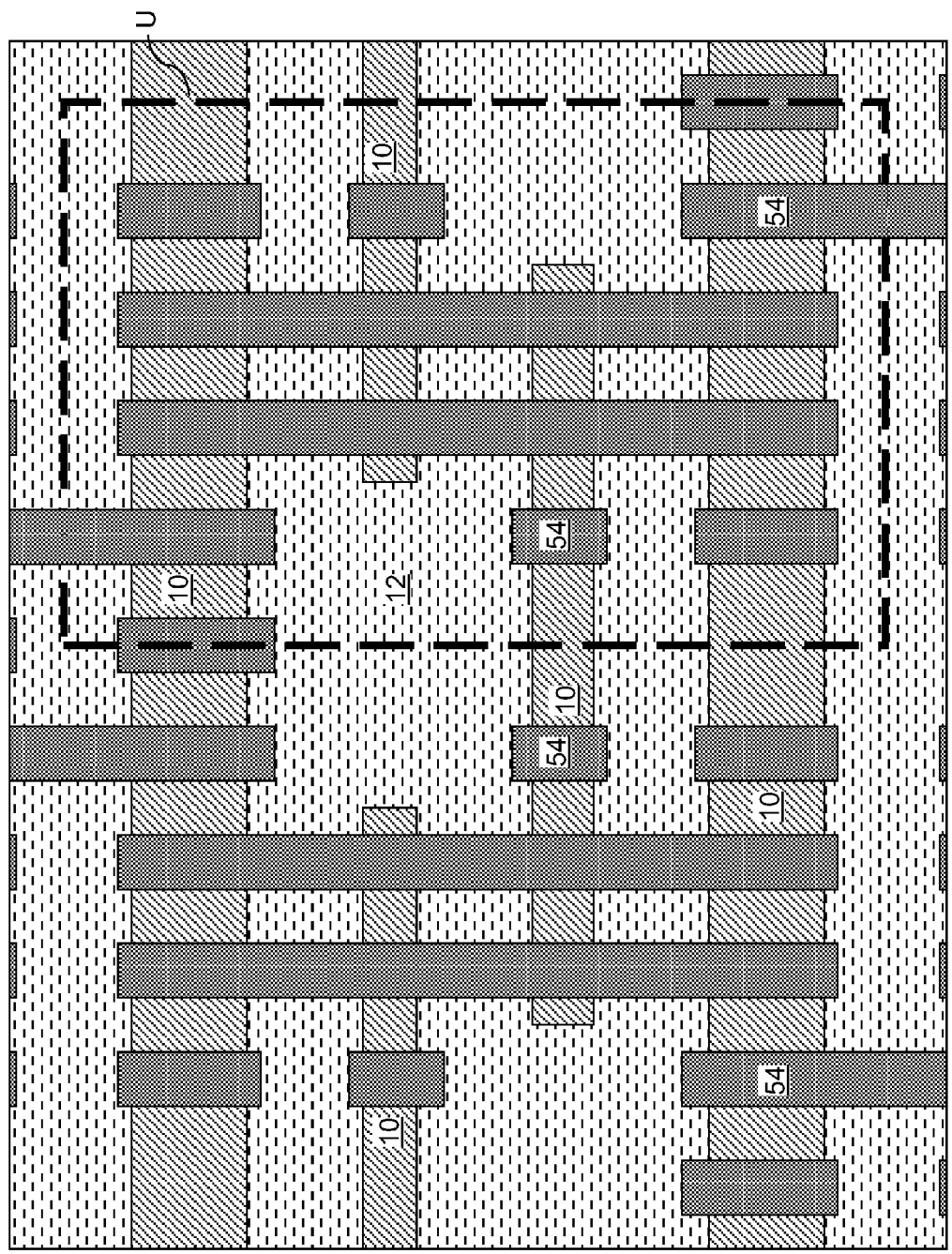
FIG. 19 is a top down view of the third exemplary semiconductor structure after patterning the plurality of at least partly disposable structures employing a cut mask and an etch according to the third embodiment of the present disclosure.

Referring to FIG. 19, the plurality of at least partly disposable structures is patterned employing a cut mask and an etch. The same processing steps can be employed as in FIGS. 2A, 2B, 3A, and 3B.

Figure 20:
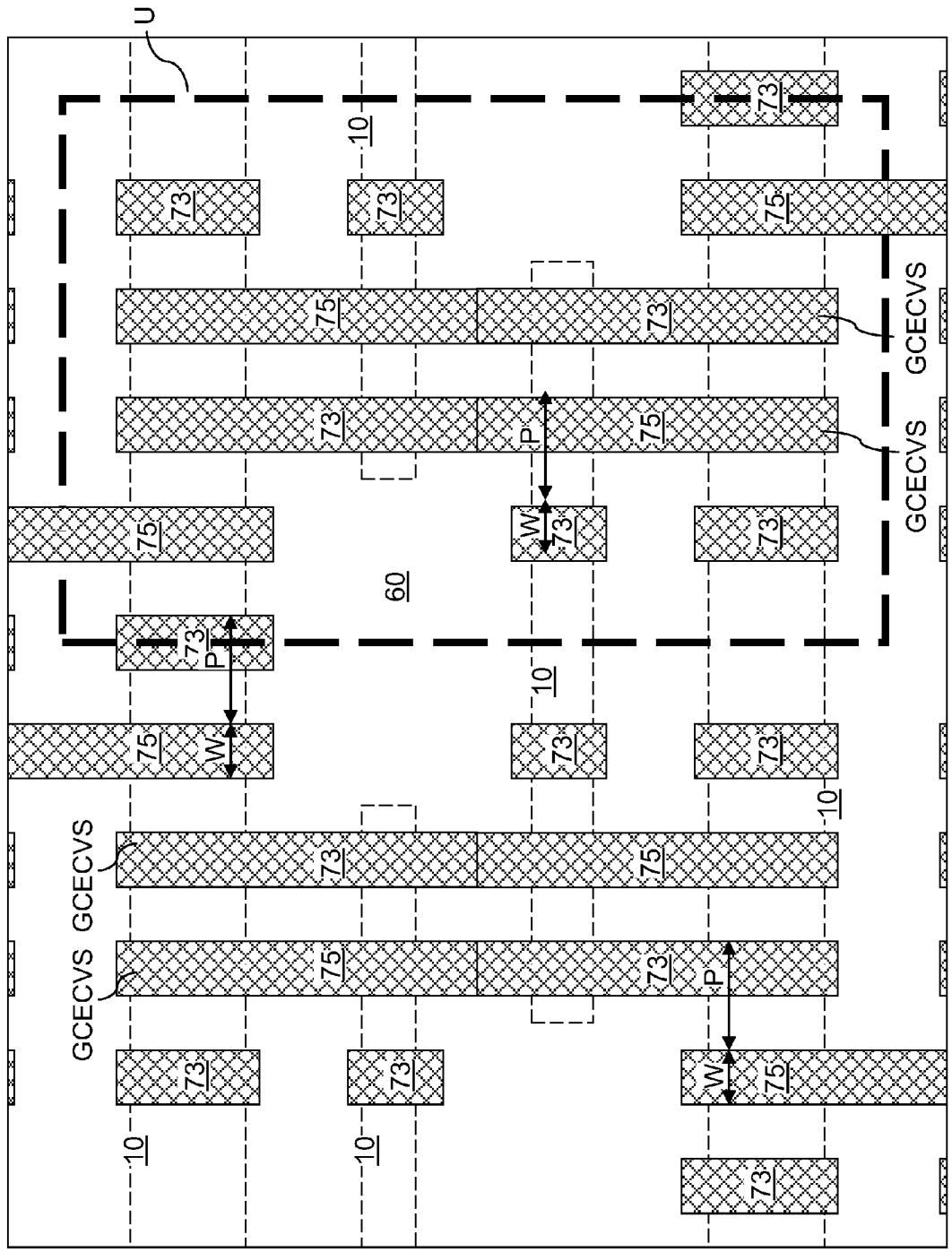
FIG. 20 is a top down view of the third exemplary semiconductor structure after formation of a plurality of parallel conductive-material-including structures employing the processing steps in FIGS. 4A-9B according to the third embodiment of the present disclosure.

Referring to FIG. 20, the processing steps of FIGS. 4A-9B can be employed to form a plurality of parallel conductive-material-including structures by substituting metallic material portions for a fraction of the plurality of at least partly disposable structures. Metallic gate conductor electrode portions 73 are formed by replacing a first portion of the plurality of at least partly disposable structures with a metallic material. Contact via structures 75 are formed by replacing a second portion of the plurality of at least partly disposable structures. Some of the contact via structures 75 can be conductively connected to one of a source region and a drain region of a transistor located on the semiconductor substrate.

Areas including a first type of conductive-material-including structures correspond to the areas in which metallic gate conductor electrode portions 75 are present. Areas including a second type of conductive-material-including structures correspond to the areas in which contact via structures 73 are present. The plurality of parallel conductive-material-including structures, which are present in areas of the metallic gate conductor electrode portions 75 and the contact via structures 73, has additional parallel sidewalls and has the constant pitch P. Each of the plurality of parallel conductive-material-including structures has a constant width W in the direction of the constant pitch P.

Figure 21:
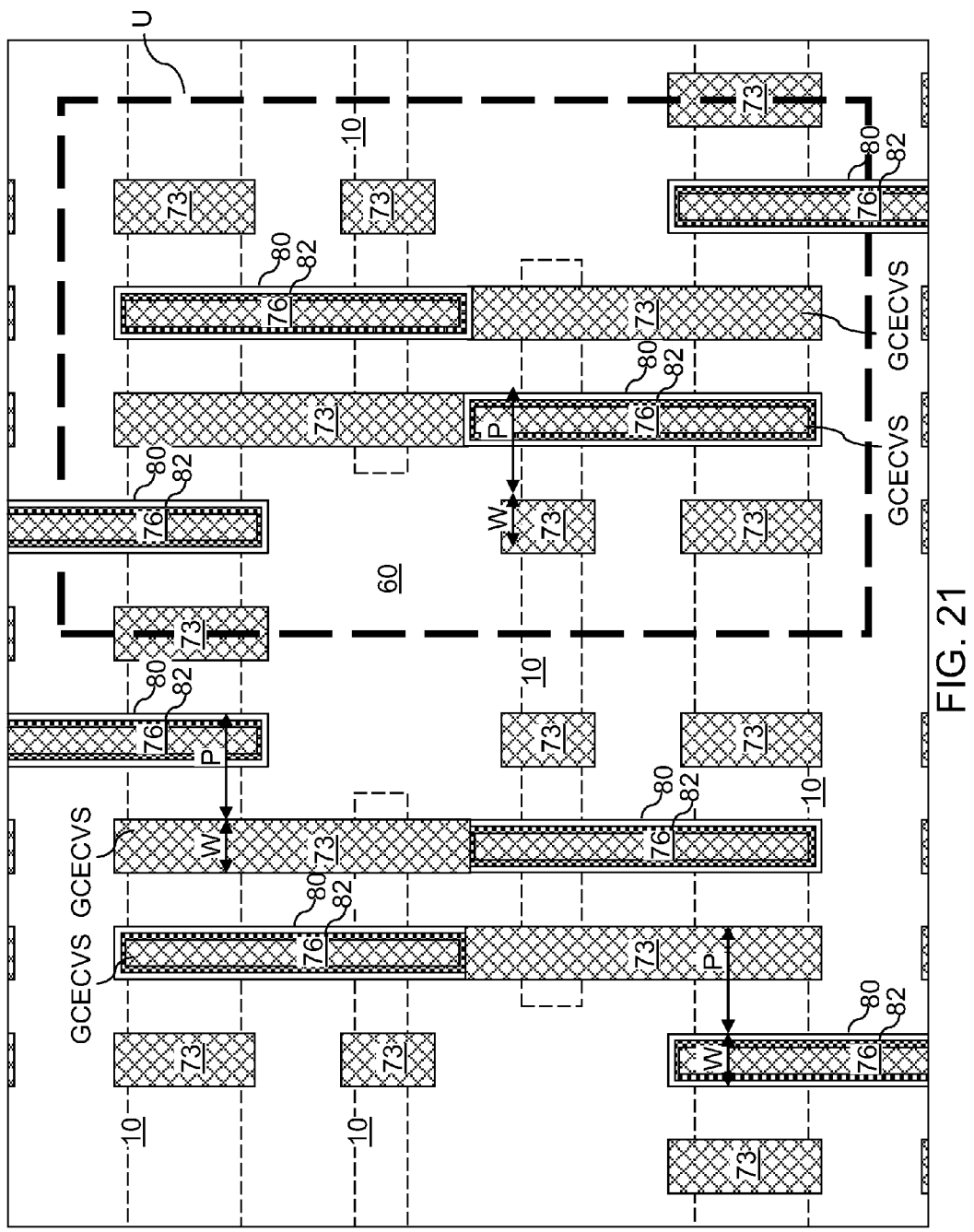
FIG. 21 is a top down view of a first variation of the third exemplary semiconductor structure after formation of a plurality of parallel conductive-material-including structures employing the processing steps in FIGS. 10A-16B according to the third embodiment of the present disclosure.

Referring to FIG. 21, a first variation of the third exemplary semiconductor structure can be formed by employing the processing steps of FIGS. 10A-16B. A plurality of parallel conductive-material-including structures is formed by substituting metallic material portions for a fraction of the plurality of at least partly disposable structures. Gate dielectrics 80, workfunction metal layers 82, and metallic gate conductor electrode portions 76 are formed by replacing a first portion of the plurality of at least partly disposable structures with a metallic material. Contact via structures 75 are formed by replacing a second portion of the plurality of at least partly disposable structures. Some of the contact via structures 75 can be conductively connected to one of a source region and a drain region of a transistor located on the semiconductor substrate.

Areas including a first type of conductive-material-including structures correspond to the areas in which gate dielectrics 80, workfunction metal layers 82, and metallic gate conductor electrode portions 76 are present. Areas including a second type of conductive-material-including structures correspond to the areas in which contact via structures 73 are present. The plurality of parallel conductive-material-including structures, which are present in areas of the gate dielectrics 80, the workfunction metal layers 82, the metallic gate conductor electrode portions 76, and the contact via structures 73, has additional parallel sidewalls and has the constant pitch P. Each of the plurality of parallel conductive-material-including structures has a constant width W in the direction of the constant pitch P.

Each of the exemplary semiconductor structure illustrated in FIGS. 20 and 21 includes a static random access memory (SRAM) cell, which includes multiple parallel conductive-material-including structures arranged in five rows at the constant pitch P. Two of the five rows include a structure that overlies four active regions, which are represented by dotted lines marked "10," and includes a gate conductor electrode and a contact via structure that are conductively connected to each other, i.e., structures labeled "GCECVS" in FIGS. 20 and 21. In FIGS. 20 and 21, all gate structures and local interconnect structures are along one direction, i.e., the direction of the parallel edges of the plurality of parallel conductive-material-including structures. While the five rows of parallel conductive-material-including structures require that the unit cell U have sufficient width to allow lithographic printing of five parallel lines and spaces, the absence of non-parallel lines during the printing of the parallel lines (See FIG. 18) can allow a smaller unit cell size for the SRAM designs of the present disclosure than conventional SRAM designs that require printing of non-parallel edges. It is noted that conventional SRAM cell structures include structures having non-parallel edges. In contrast, the layout of the SRAM cell of the present disclosure consists of structures having parallel edges, i.e., structures having non-parallel edges are completely absent at the gate level in the SRAM cell of the present disclosure.

Figure 22:
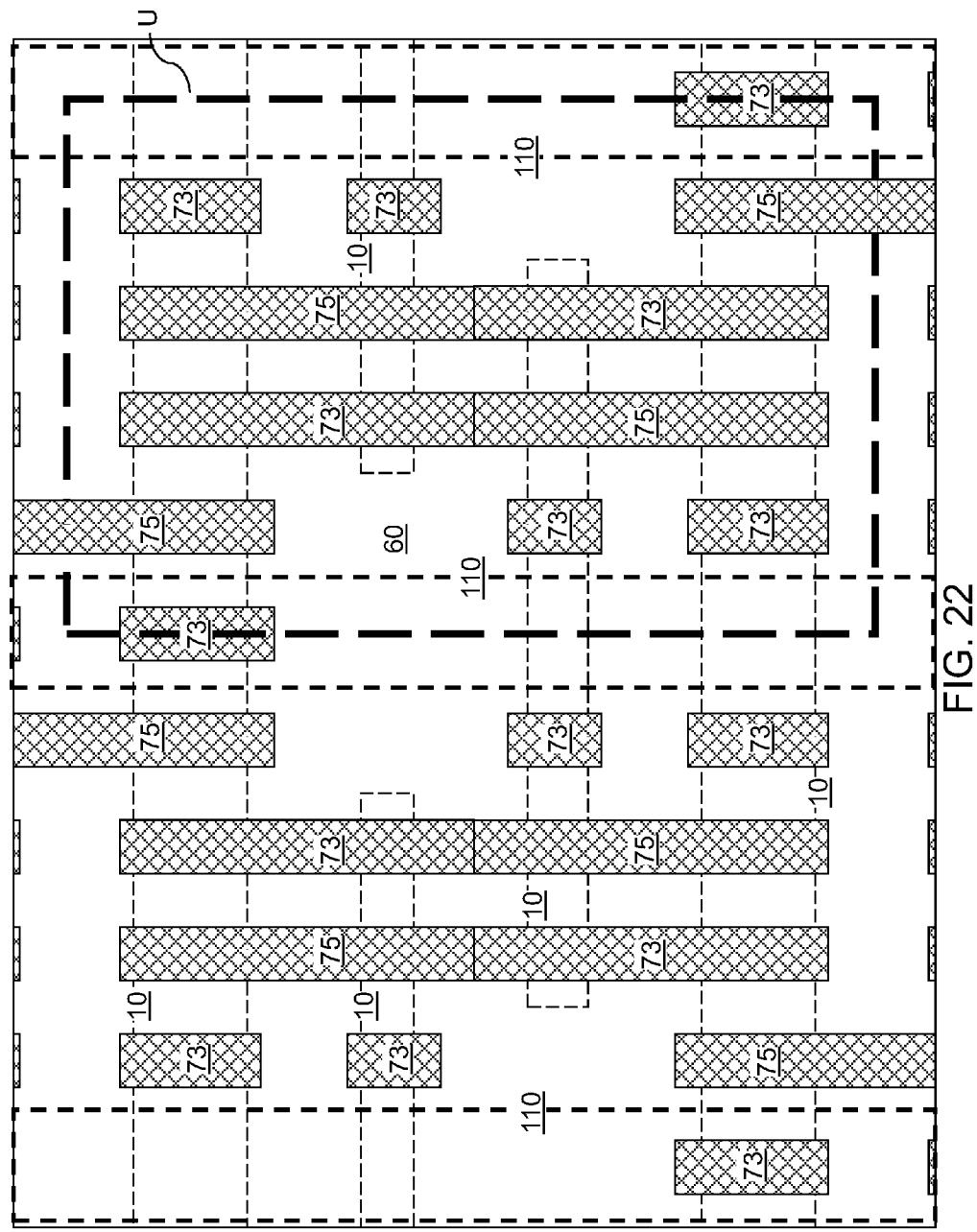
FIG. 22 is a top down view of the third exemplary semiconductor structure of FIG. 20 with dotted lines indicating the locations of first-level metal lines according to the third embodiment of the present disclosure.

Referring to FIG. 22, dotted lines indicate the edges of first-level metal lines 110 to be formed on the plurality of parallel conductive-material-including structures in an exemplary metal wiring scheme. The first-level metal lines 110 are bit lines.

Figure 23:
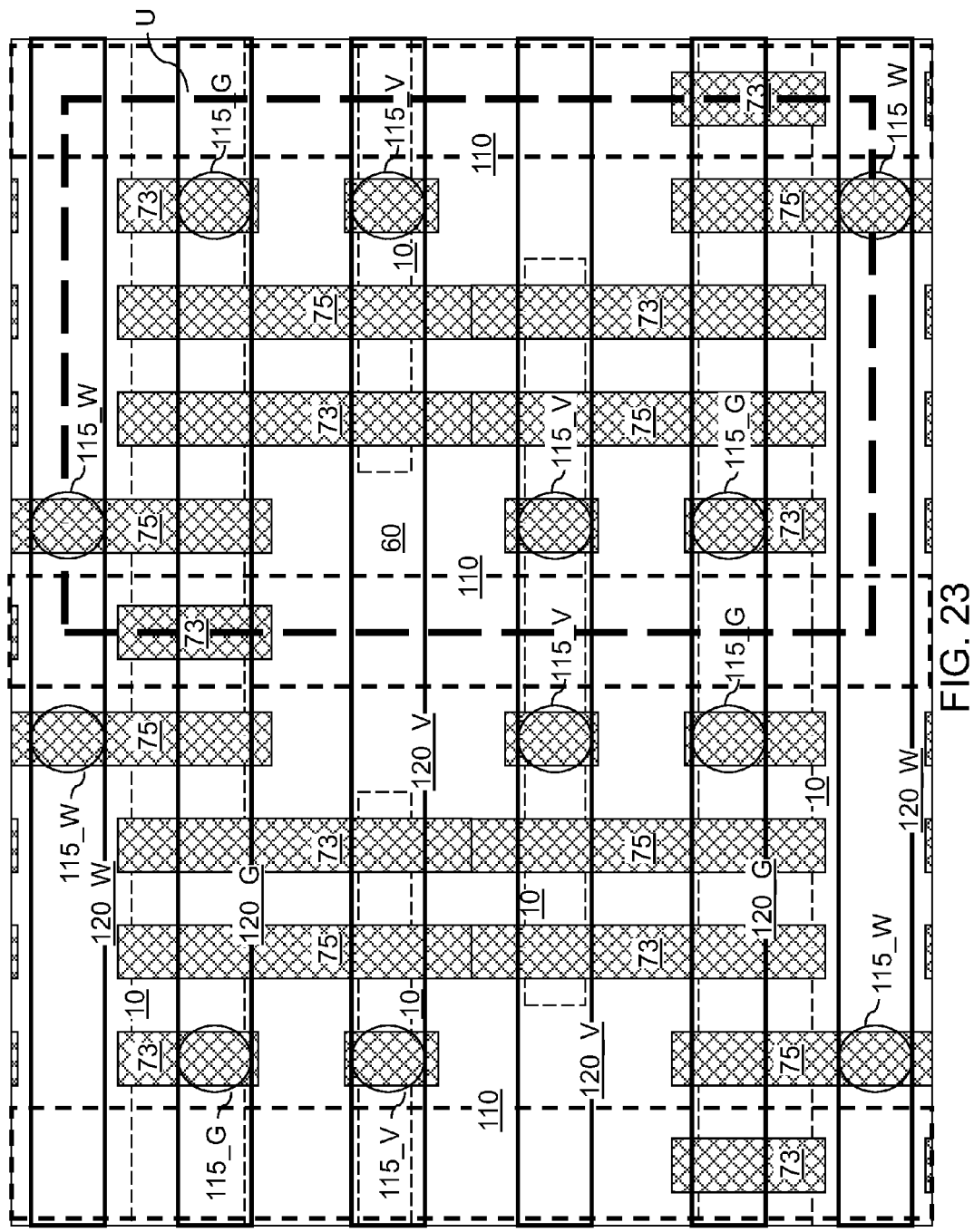
FIG. 23 is a top down view of the third exemplary semiconductor structure of FIG. 20 with solid lines indicating the locations of first level metal vias and second-level metal lines according to the third embodiment of the present disclosure.

Referring to FIG. 23, solid lines indicate the edges first level metal vias and second-level metal lines to be formed on the first-level metal lines 110. The first level metal vias include word line first level metal vias 115_W that are connected to word lines, power supply first level metal vias 115_V that provide a power supply voltage, and ground first level metal vias 115_G that provide electrical ground. The second level metal lines include word line second level metal lines 120_W that are connected to word lines, power supply second level metal lines 120_V that provide a power supply voltage, and ground second level metal lines 120_G that provide electrical ground.

Figure 24:
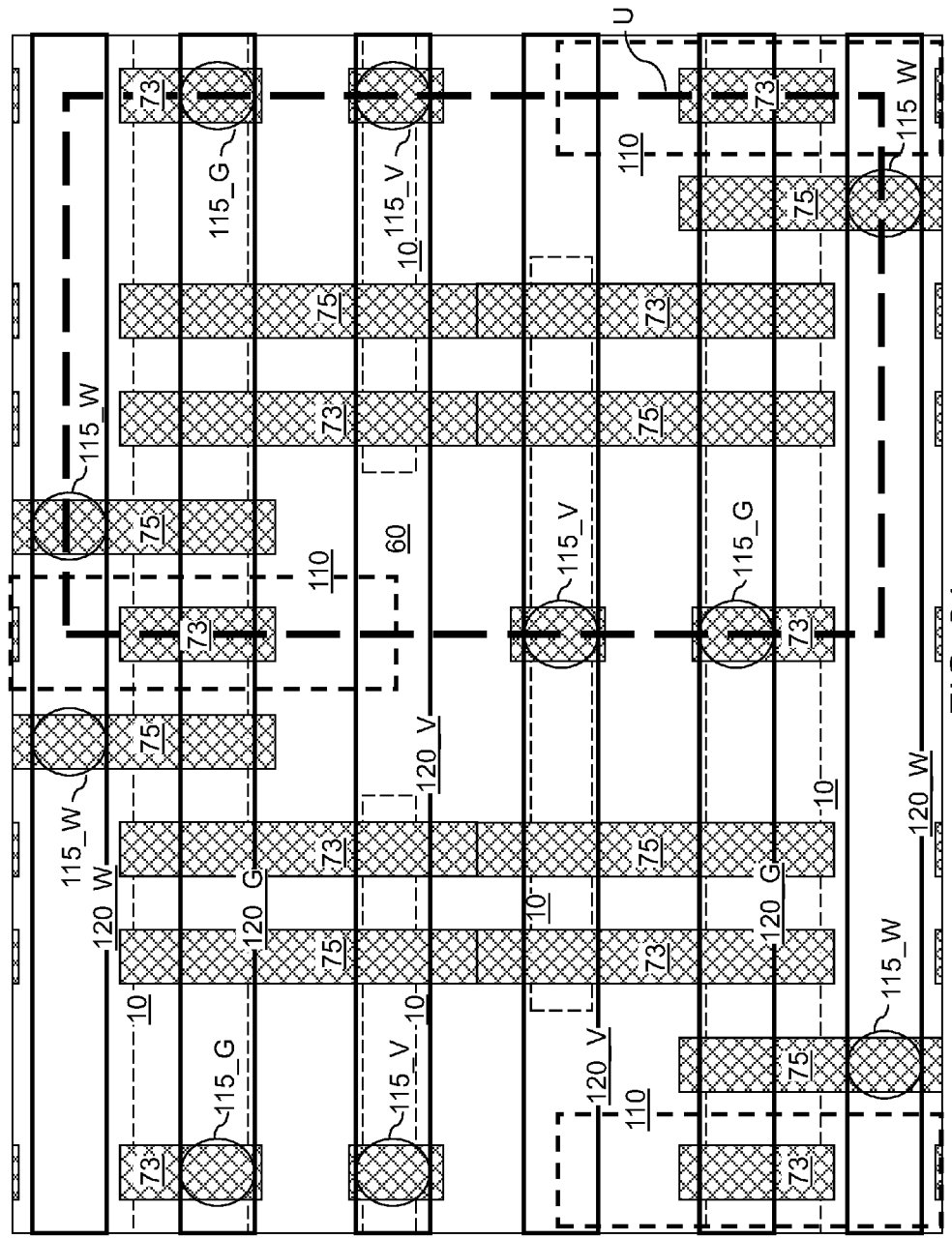
FIG. 24 is a top down view of a second variation of the third exemplary semiconductor structure with dotted lines indicating the locations of first-level metal lines and with solid lines indicating the locations of first level metal vias and second-level metal lines according to the third embodiment of the present disclosure.

Referring to FIG. 24, in a second variation of the third exemplary semiconductor structure, power supply first level metal vias 115_V and ground first level metal vias 115_G can be shared between adjacent unit cells.

Figure 25:
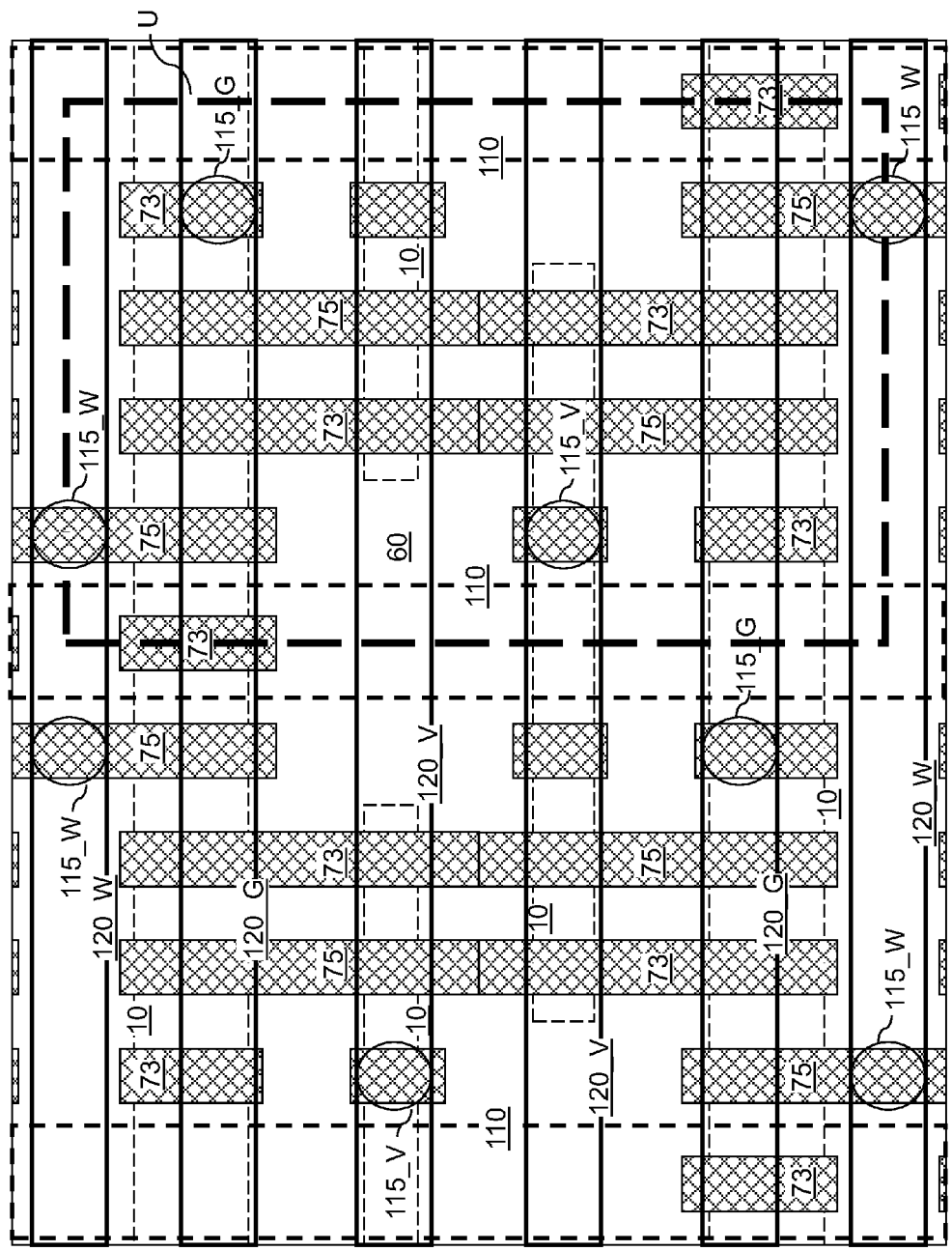
FIG. 25 is a top down view of a third variation of the third exemplary semiconductor structure with dotted lines indicating the locations of first-level metal lines and with solid lines indicating the locations of first level metal vias and second-level metal lines according to the third embodiment of the present disclosure.

Referring to FIG. 25, in a third variation of the third exemplary semiconductor structure, power supply first level metal vias 115_V and ground first level metal vias 115_G are shared and misplaced in order to maximize the distance between a pair of a power supply first level metal via 115_V and a ground first level metal via 115_G.

Figure 26:
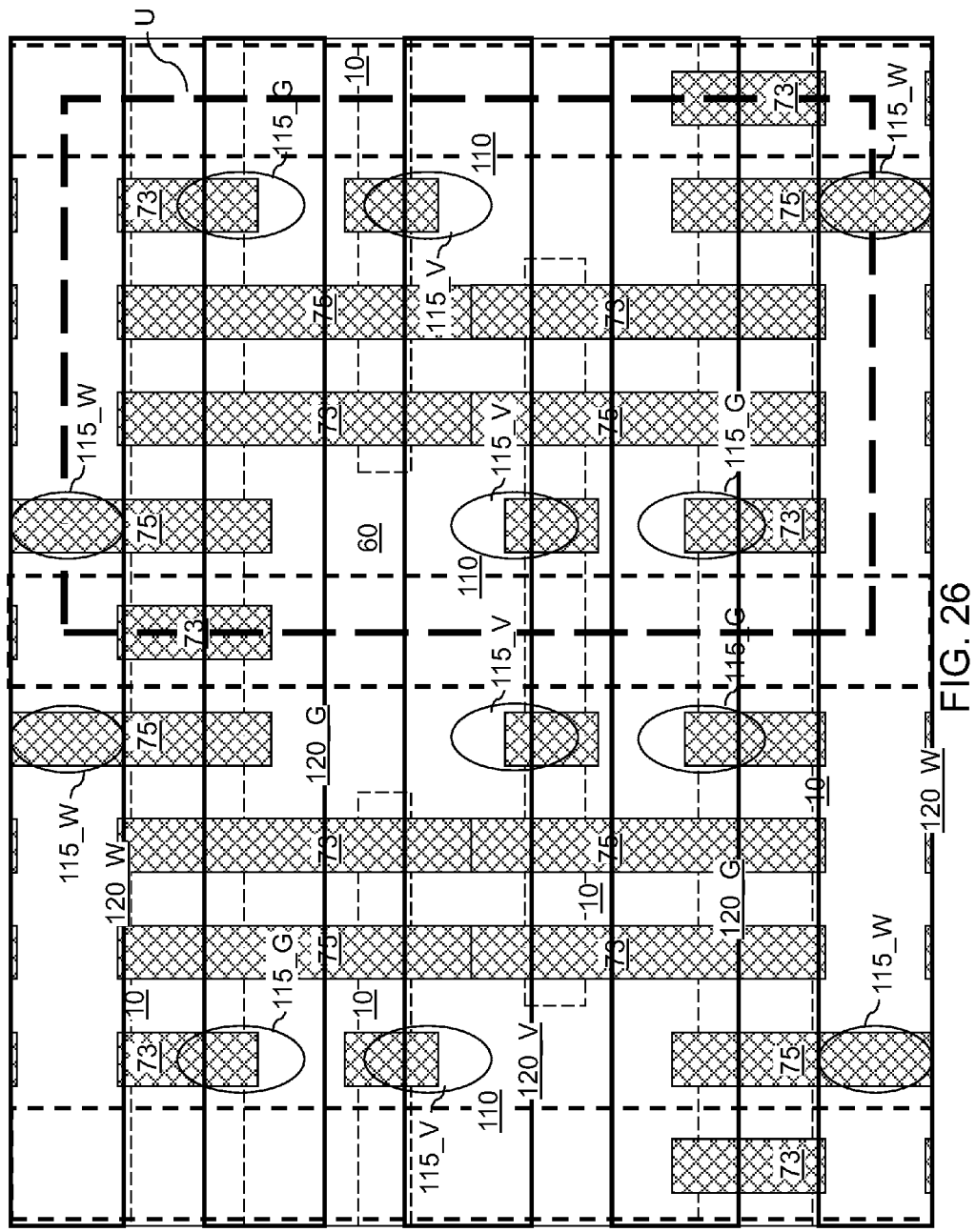
FIG. 26 is a top down view of a fourth variation of the third exemplary semiconductor structure with dotted lines indicating the locations of first-level metal lines and with solid lines indicating the locations of first level metal vias and second-level metal lines according to the third embodiment of the present disclosure.

Referring to FIG. 26, in a fourth variation of the third exemplary semiconductor structure, a power supply second level metal lines 120_V is shared between two pFETs in a unit cell U to relax the pitch of the second level metal lines (120_W, 120_V, 120_G).

Figure 27:
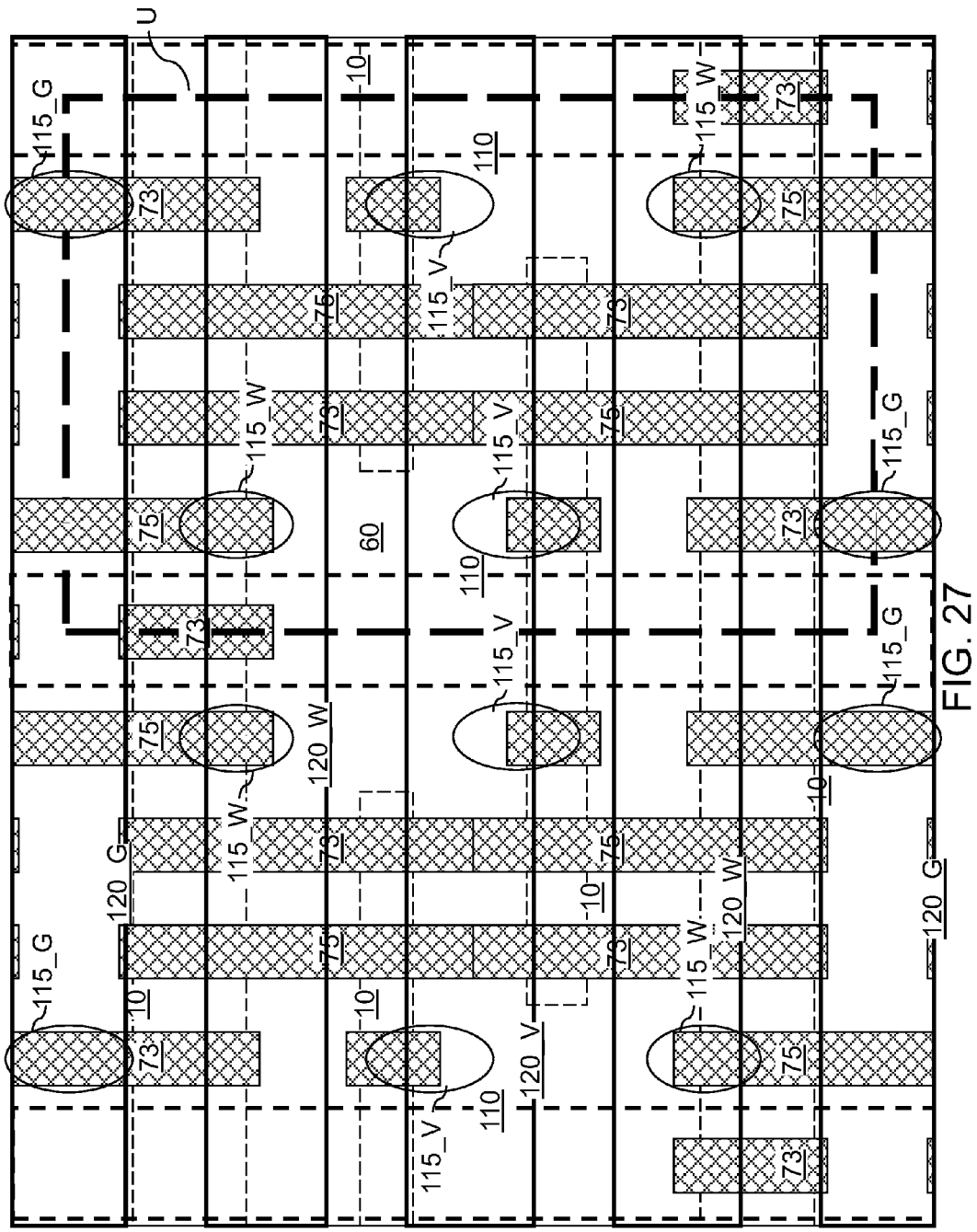
FIG. 27 is a top down view of a fifth variation of the third exemplary semiconductor structure with dotted lines indicating the locations of first-level metal lines and with solid lines indicating the locations of first level metal vias and second-level metal lines according to the third embodiment of the present disclosure.

Referring to FIG. 27, in a fifth variation of the third exemplary semiconductor structure, a ground second level metal lines 120_G is shared between two unit cells to relax the pitch of the second level metal lines (120_W, 120_V, 120_G).

Figure 28:
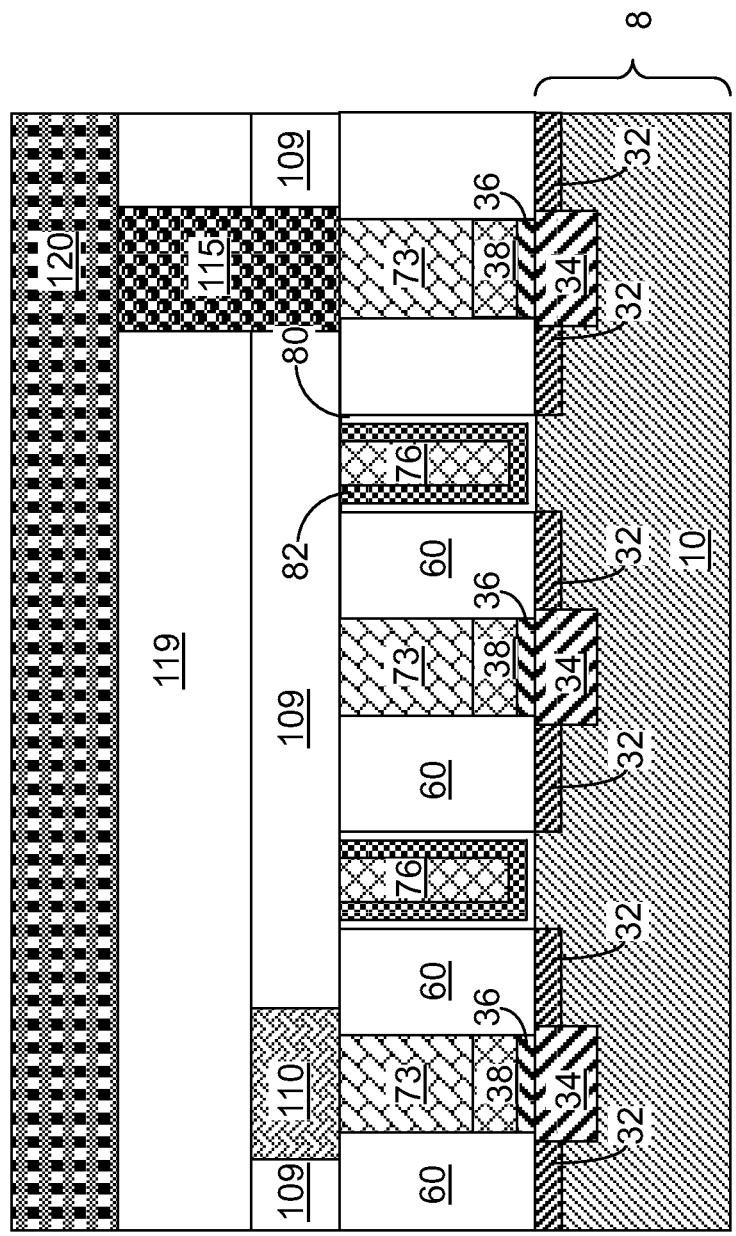
FIG. 28 is a schematic vertical cross-sectional view of an exemplary semiconductor structure illustrating the vertical locations of first-level metal lines, first level metal vias, and second-level metal lines relative to underlying structures in an area where multiple parallel conductive-material-including structures are spaced at a constant pitch.

Referring to FIG. 28, an exemplary semiconductor structure illustrates the vertical locations of first-level metal lines 110, first level metal vias (115_W, 115_V, 115_G), and second-level metal lines (120_W, 120_V, 120_G) relative to underlying structures in an area where multiple parallel conductive-material-including structures are spaced at a constant pitch. The first level metal line 110 is embedded in a first line level dielectric material layer 109. The first metal via 115 illustrated in FIG. 28 can be any of the various first level metal vias (115_W, 115_V, 115_G) described above. The first metal via 115 is embedded in the first line level dielectric material layer 109 and a first via level dielectric material layer 119. The second metal line 120 illustrated in FIG. 28 can be any of various second level metal lines (120_W, 120_V, 120_G) described above. The second metal line 120 is embedded in a second line level dielectric material layer 119.

Figure 29:
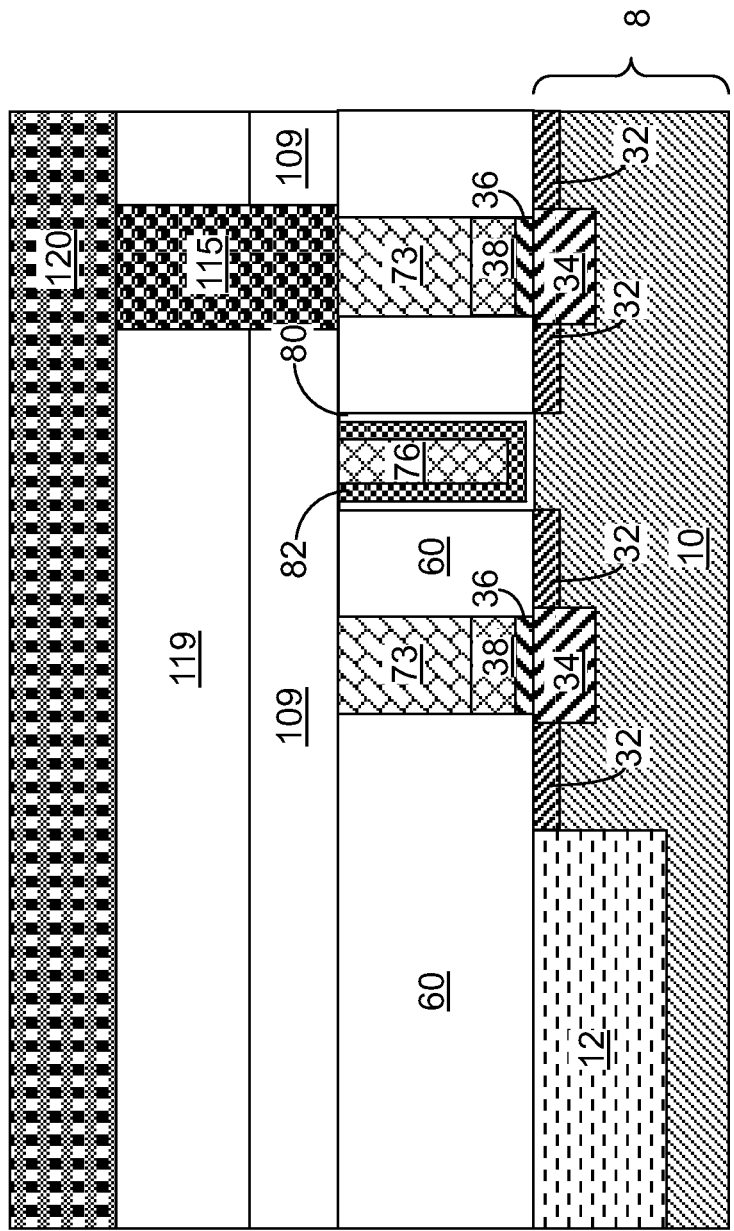
FIG. 29 is another schematic vertical cross-sectional view of the exemplary semiconductor structure illustrating the vertical locations of first-level metal lines, first level metal vias, and second-level metal lines relative to underlying structures in an area where a shallow trench isolation structure is present adjacent to multiple parallel conductive-material-including structures spaced at a constant pitch.

Referring to FIG. 29, another schematic vertical cross-sectional view of the exemplary semiconductor structure illustrates the vertical locations of first-level metal lines, first level metal vias, and second-level metal lines relative to underlying structures in an area where a shallow trench isolation structure is present adjacent to multiple parallel conductive-material-including structures spaced at a constant pitch.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising a plurality of parallel conductive-material-including structures having parallel sidewalls and located on a semiconductor substrate and having a constant pitch in a horizontal direction perpendicular to said parallel sidewalls, wherein one of said plurality of parallel conductive-material-including structures includes a metallic gate conductor electrode portion comprising a metallic material and another of said plurality of parallel conductive-material-including structures includes a contact via structure comprising said metallic material and conductively connected to one of a source region and a drain region of a transistor located on said semiconductor substrate.

2. The semiconductor structure of claim 1, wherein each of said plurality of parallel conductive-material-including structures has a constant width in a direction of said constant pitch.

3. The semiconductor structure of claim 1, wherein said metallic gate conductor electrode portion is a portion of a gate conductor electrode of said transistor, and said plurality of parallel conductive-material-including structures includes another contact via structure comprising said metallic material and conductively connected to the other of said source region and said drain region of said transistor.

4. The semiconductor structure of claim 1, wherein said one of said plurality of parallel conductive-material-including structures includes a gate dielectric and said metallic gate conductor electrode portion, wherein a distance between a sidewall of said metallic gate conductor electrode portion and a sidewall of said contact via structure is equal to said constant pitch.

5. The semiconductor structure of claim 4, further comprising:
 a gate metal-semiconductor-alloy portion contacting a bottom surface of said metallic gate conductor electrode portion; and
 a contact metal-semiconductor-alloy portion contacting a bottom surface of said contact via structure and having a same width as said gate metal-semiconductor-alloy portion.

6. The semiconductor structure of claim 1, wherein said one of said plurality of parallel conductive-material-including structures includes a U-shaped gate dielectric and said metallic gate conductor electrode portion, wherein a distance between an outer sidewall of said U-shaped gate dielectric and a sidewall of said contact via structure is equal to said constant pitch.

7. The semiconductor structure of claim 6, further comprising a workfunction metal layer contacting inner sidewalls and an upper surface of said U-shaped gate dielectric and outer sidewalls and a bottom surface of said metallic gate conductor electrode portion.

8. The semiconductor structure of claim 1, wherein said one of said plurality of parallel conductive-material-including structures further includes another contact via structure comprising said metallic material and conductively connected to one of a source region and a drain region of another transistor located on said semiconductor substrate, wherein said metallic gate conductor electrode portion is conductively connected to said other contact via structure within said one of said plurality of parallel conductive-material-including structure.

9. The semiconductor structure of claim 1, further comprising a contact-level dielectric material layer having a top surface that is coplanar with top surfaces of said plurality of parallel conductive-material-including structures.

10. A static random access memory (SRAM) cell comprising a plurality of parallel conductive-material-including structures having parallel sidewalls and located on a semiconductor substrate and having a constant pitch in a horizontal direction perpendicular to said parallel sidewalls, wherein one of said plurality of parallel conductive-material-including structures includes a metallic gate conductor electrode portion comprising a metallic material and another of said plurality of parallel conductive-material-including structures includes a contact via structure comprising said metallic material and conductively connected to one of a source region and a drain region of a transistor located on said semiconductor substrate, wherein said plurality of parallel conductive-material-including structures is arranged in five rows at said constant pitch, wherein two of said five rows includes a structure overlying four active regions and including a gate conductor electrode and a contact via structure that are conductively connected to each other.

11. A method of forming a semiconductor structure comprising:
 forming a plurality of at least partly disposable structures having parallel sidewalls on a semiconductor substrate, said plurality of at least partly disposable structures having a constant pitch in a horizontal direction perpendicular to said parallel sidewalls;
 forming and planarizing a dielectric material layer, wherein a top surface of said planarized dielectric material layer is coplanar with top surfaces of said plurality of at least partly disposable structures;
 forming a metallic gate conductor electrode portion by substituting a first portion of said plurality of at least partly disposable structures with a metallic material; and
 forming a contact via structure comprising said metallic material by substituting a second portion of said plurality of at least partly disposable structures, wherein said contact via structure is conductively connected to one of a source region and a drain region of a transistor located on said semiconductor substrate.

12. The method of claim 11, wherein each of said plurality of at least partly disposable structures has a constant width in a direction of said constant pitch.

13. The method of claim 11, wherein said metallic gate conductor electrode portion and said contact via structure are formed simultaneously by depositing said metallic material within cavities formed after removal of at least a portion of said plurality of at least partly disposable structures.

14. The method of claim 11, wherein a subset of said plurality of at least partly disposable structures remains on said semiconductor substrate after formation of said metallic gate conductor electrode portion and said contact via structure.

15. The method of claim 14, wherein said subset of said at least partly disposable structures includes a gate dielectric and a semiconductor gate electrode portion.

16. The method of claim 11, wherein said plurality of at least partly disposable structures contacts a top surface of said semiconductor substrate, and an entirety of said plurality of at least partly disposable structures is removed before formation of said metallic gate conductor electrode portion and said contact via structure.

17. The method of claim 16, further comprising:
 removing one of said plurality of at least partly disposable structures to form a cavity, wherein a top surface of said semiconductor substrate is exposed within said cavity;
 forming a dielectric layer within said cavity; and
 forming a workfunction metal layer on dielectric layer, wherein said metallic gate conductor electrode portion is formed on said workfunction metal layer.

18. The method of claim 11, wherein said first portion and said second portion are located within one of said plurality of at least partly disposable structures, and said metallic gate conductor electrode portion and said contact via structure are conductively connected to each other.

19. The method of claim 11, further comprising forming a plurality of parallel conductive-material-including structures by substituting metallic material portions for a fraction of said plurality of at least partly disposable structures, wherein said plurality of parallel conductive-material-including structures has additional parallel sidewalls and are located on said semiconductor substrate and has said constant pitch.

20. A method of forming a semiconductor structure including a static random access memory (SRAM) cell, said method comprising:
 forming a plurality of at least partly disposable structures having parallel sidewalls on a semiconductor substrate, said plurality of at least partly disposable structures having a constant pitch in a horizontal direction perpendicular to said parallel sidewalls;
 forming and planarizing a dielectric material layer, wherein a top surface of said planarized dielectric material layer is coplanar with top surfaces of said plurality of at least partly disposable structures;
 forming a metallic gate conductor electrode portion by substituting a first portion of said plurality of at least partly disposable structures with a metallic material; and
 forming a contact via structure comprising said metallic material by substituting a second portion of said plurality of at least partly disposable structures, wherein said contact via structure is conductively connected to one of a source region and a drain region of a transistor located on said semiconductor substrate, wherein multiple parallel conductive-material-including structures arranged in five rows at said constant pitch are formed, wherein two of said five rows includes a structure overlying four active regions and including a gate conductor electrode and a contact via structure that are conductively connected to each other, and said multiple parallel conductive-material-including structures function as gate electrodes and local interconnect structures of an SRAM cell.

* * * * *